United States Patent
Maejima et al.

(10) Patent No.: US 8,218,328 B2
(45) Date of Patent: Jul. 10, 2012

(54) SEMICONDUCTOR DEVICE

(75) Inventors: Nobuyoshi Maejima, Tokyo (JP); Ryota Sato, Tokyo (JP)

(73) Assignee: Murata Manufacturing Co., Ltd., Nagaokakyo-shi, Kyoto (JP)

( * ) Notice: Subject to any disclaimer, the term of this patent is extended or adjusted under 35 U.S.C. 154(b) by 365 days.

(21) Appl. No.: 12/687,114

(22) Filed: Jan. 13, 2010

(65) Prior Publication Data
US 2010/0182755 A1    Jul. 22, 2010

(30) Foreign Application Priority Data
Jan. 21, 2009  (JP) ................................ 2009-010757

(51) Int. Cl.
*H05K 7/02* (2006.01)
*H05K 7/06* (2006.01)
*H05K 7/08* (2006.01)
*H05K 7/10* (2006.01)

(52) U.S. Cl. ........ 361/760; 361/782; 361/784; 361/794; 361/795

(58) Field of Classification Search .......... 361/782–784, 361/792–795; 257/691–692, 720–730
See application file for complete search history.

(56) References Cited

U.S. PATENT DOCUMENTS

| | | | | |
|---|---|---|---|---|
| 7,141,876 | B2* | 11/2006 | Akamine et al. | 257/728 |
| 7,154,760 | B2* | 12/2006 | Konishi et al. | 361/783 |
| 7,176,579 | B2* | 2/2007 | Konishi et al. | 257/777 |

FOREIGN PATENT DOCUMENTS

JP        2006-66731 A     3/2006

\* cited by examiner

*Primary Examiner* — Tuan T Dinh
(74) *Attorney, Agent, or Firm* — Miles & Stockbridge P.C.

(57) ABSTRACT

To provide a technique that can improve the reliability of coupling between a package with a PA module and a mounting board in mounting the package over the mounting board. The width of a back conductor pattern is made smaller than the width of each of back terminals. Specifically, for example, the back terminals are arranged in the X direction. The back terminals arranged in parallel to the X direction are coupled together by the back conductor pattern. At this time, the coupling direction (coupling line direction) of the back conductor pattern is the X direction. Taking into consideration the Y direction orthogonal to (intersecting) the X direction, the width of the back conductor pattern in the Y direction is made smaller than the width of each of the back terminals in the Y direction.

20 Claims, 17 Drawing Sheets

SEMICONDUCTOR DEVICE

CROSS-REFERENCE TO RELATED APPLICATIONS

The disclosure of Japanese Patent Application No. 2009-10757 filed on Jan. 21, 2009 including the specification, drawings and abstract is incorporated herein by reference in its entirety.

BACKGROUND OF THE INVENTION

The present invention relates to semiconductor devices, and more particularly to a technique effectively applied to a semiconductor device in which a wiring board with a semiconductor chip mounted thereover is mounted over a mounting board (motherboard).

Japanese Unexamined Patent Publication No. 2006-66731 (Patent Document 1) discloses a back electrode pattern on a wiring board to be used in a high-frequency module.

SUMMARY OF THE INVENTION

In recent years, mobile communication devices (for example, a cellular phone), typified by a global system for mobile communications (GSM), a personal communication system (PCS), a personal digital cellular (PDC), or a code division multiple access (CDMA), have gained widespread use throughout the world. In general, this kind of mobile communication device includes an antenna for radiating and receiving radio waves, an antenna switch for switching between transmission and reception at the antenna, and a high-frequency power amplifier (power amplifier (PA) module) for amplifying a high-frequency signal obtained by power modulation to supply the amplified signal to the antenna. The mobile communication device further includes a receiver for processing the high-frequency signal received by the antenna, a controller for controlling these components, and a cell (battery) for supplying a power supply voltage to these components.

As an amplification element used in a power amplifier circuit of the PA module of the mobile communication device, a compound semiconductor device, such as a HBT or a HEMT, a silicon bi-polar transistor, or a laterally diffused metal oxide semiconductor field effect transistor (LDMOSFET), is used according to the object or conditions.

For example, the PA module includes a power amplifier (power amplifier circuit) formed in one semiconductor chip made of silicon and adapted to amplify power, and a power controller adapted to control the amplification performed by the power amplifier circuit. At this time, the power amplifier is adapted to carry out multi-stage amplification, and, for example, uses a LDMOSFET serving as an amplification element for all multi stages. The power controller uses a normal complementary metal oxide semiconductor field effect transistor (CMOSFET).

By mounting the thus-structured semiconductor chip on a wiring board, the PA module is formed. That is, a package (semiconductor device) having the semiconductor chip mounted on the wiring board serves as the PA module. The package forming the PA module is mounted, for example, on a motherboard (mounting board) of the mobile communication device.

The form of package forming the PA module in use is, for example, a land grid array (LGA). In the LGA, a semiconductor chip is first mounted on the surface (main surface) of a wiring board, and a bonding pad formed in the semiconductor chip is bonded to a terminal formed on the surface of the wiring board via a wire. The terminal formed on the surface of the wiring board is electrically coupled to a via or via hole penetrating the wiring board. The via penetrating the wiring board is coupled to another terminal formed at the back surface of the wiring board. The terminal formed at the back surface of the wiring board serves as an external connection terminal. Specifically, in the LGA, a plurality of terminals are formed at the back surface of the wiring board. For example, a terminal for a first reference potential is formed in the center of the back surface of the wiring board, and a plurality of terminals are formed around the perimeter of the wiring board surrounding the terminal for the first reference potential. The terminals arranged around the perimeter of the wiring board include a terminal for a signal, and a terminal for a second reference potential. That is, in the LGA, there are the terminals for supplying the reference potentials (ground potentials) (for example, the terminal for the first reference potential and the terminal for the second reference terminal).

At this time, the terminal for the first reference potential and the terminal for the second reference potential which supply the same reference potential are electrically independent from each other thereby to supply the potential to the respective component circuits of an integrated circuit in the semiconductor chip. In contrast, by electrically coupling the terminal for the first reference potential to the terminal for the second reference potential, the stability of the reference potential is reinforced. That is, when the reference potential fluctuates to become unstable, the integrated circuit may not be operated normally due to an oscillation phenomenon generated in the integrated circuit. Therefore, it is desirable that the reference potential is stably supplied. The inventors have found through studies that the terminals for supplying the reference potential (that is, the terminal for the first reference potential, and the terminal for the second reference potential) are electrically coupled to each other, thereby stabilizing the reference potential, as compared to the case where terminals for supplying the reference potential (for example, the terminal for the first reference potential and the terminal for the second reference potential) are electrically independent from each other.

Thus, in the LGA forming the PA module, for the purpose of achieving the stability of the reference potential, the terminal for the first reference potential and the terminal for the second reference potential which are formed at the back surface of the wiring board are electrically coupled to each other by a conductor pattern formed at the back surface.

This structure, however, have the following problems. That is, the LGA forming the PA module is mounted on the mounting board (motherboard). At this time, the LGA is mounted on the mounting board such that the terminal formed at the back surface of the LGA and the electrode formed on the mounting board are coupled to each other via solder. The terminals formed on the back surface of the LGA include terminals coupled to each other by a conductor pattern, like the terminal for the first reference potential and the terminal for the second reference potential, and a terminal independently arranged, like a signal terminal. In this case, there occurs a difference in area between the terminals coupled to each other by the conductor pattern and the terminal independently arranged, which also makes a difference in area between solders formed on the respective terminals. As a result, the solder formed on each of the terminals coupled together by the conductor pattern differs in thickness from the solder formed on the terminal independently arranged. This possibly results in poor contact (failure of mounting) between a part of the terminals and the electrode formed at the mounting board.

Accordingly, it is an object of the present invention to provide a technique that can improve the reliability of coupling between a package including a PA module and a mounting board in mounting the package over the mounting board.

The above and other objects and new features of the invention will become apparent from the following description of the present application when taken in conjunction with the accompanying drawings.

The outline of representative aspects of the invention disclosed in the present application will be briefly described below.

A semiconductor device according to a representative embodiment of the invention includes (a) a first semiconductor chip having an integrated circuit formed therein to serve as a power amplifier, and (b) a rectangular wiring board including a chip mounting surface for mounting the first semiconductor chip thereover, and a back surface opposite to the chip mounting surface, the wiring board having the first semiconductor chip mounted over the chip mounting surface. The back surface of the wiring board is provided with (b1) a central ground terminal formed in the center of the back surface and to which a ground potential is applied, and (b2) a plurality of peripheral terminals formed around a perimeter of the wiring board so as to surround the central ground terminal. The peripheral terminals include a first peripheral ground terminal and a second peripheral ground terminal arranged adjacent to each other, and to each of which the ground potential is applied. The first peripheral ground terminal and the second peripheral ground terminal are electrically coupled together by a conductor pattern formed at the back surface. At this time, a width of the conductor pattern is smaller than a width of each of the first peripheral ground terminal and the second peripheral ground terminal.

A semiconductor device of another representative embodiment of the invention includes (a) a first semiconductor chip having an integrated circuit formed therein to serve as a power amplifier, and (b) a rectangular wiring board including a chip mounting surface for mounting the first semiconductor chip thereover, and a back surface opposite to the chip mounting surface, the wiring board having the first semiconductor chip mounted over the chip mounting surface. The back surface of the wiring board is provided with (b1) a central ground terminal formed in the center of the back surface and to which a ground potential is applied, and (b2) a plurality of peripheral terminals formed around a perimeter of the wiring board so as to surround the central ground terminal. The peripheral terminals include a first peripheral ground terminal to which a ground potential is applied, and the central ground terminal and the first peripheral ground terminal are electrically coupled together by a conductor pattern formed at the back surface. At this time, a width of the conductor pattern is smaller than a width of the first peripheral ground terminal.

The effects obtained by the representative aspects of the invention disclosed in the present application will be briefly described below.

According to the invention, the reliability of coupling between a package including a PA module and a mounting board can be improved in mounting the package over the mounting board.

DETAILED DESCRIPTION OF THE PREFERRED EMBODIMENTS

Figure 1:
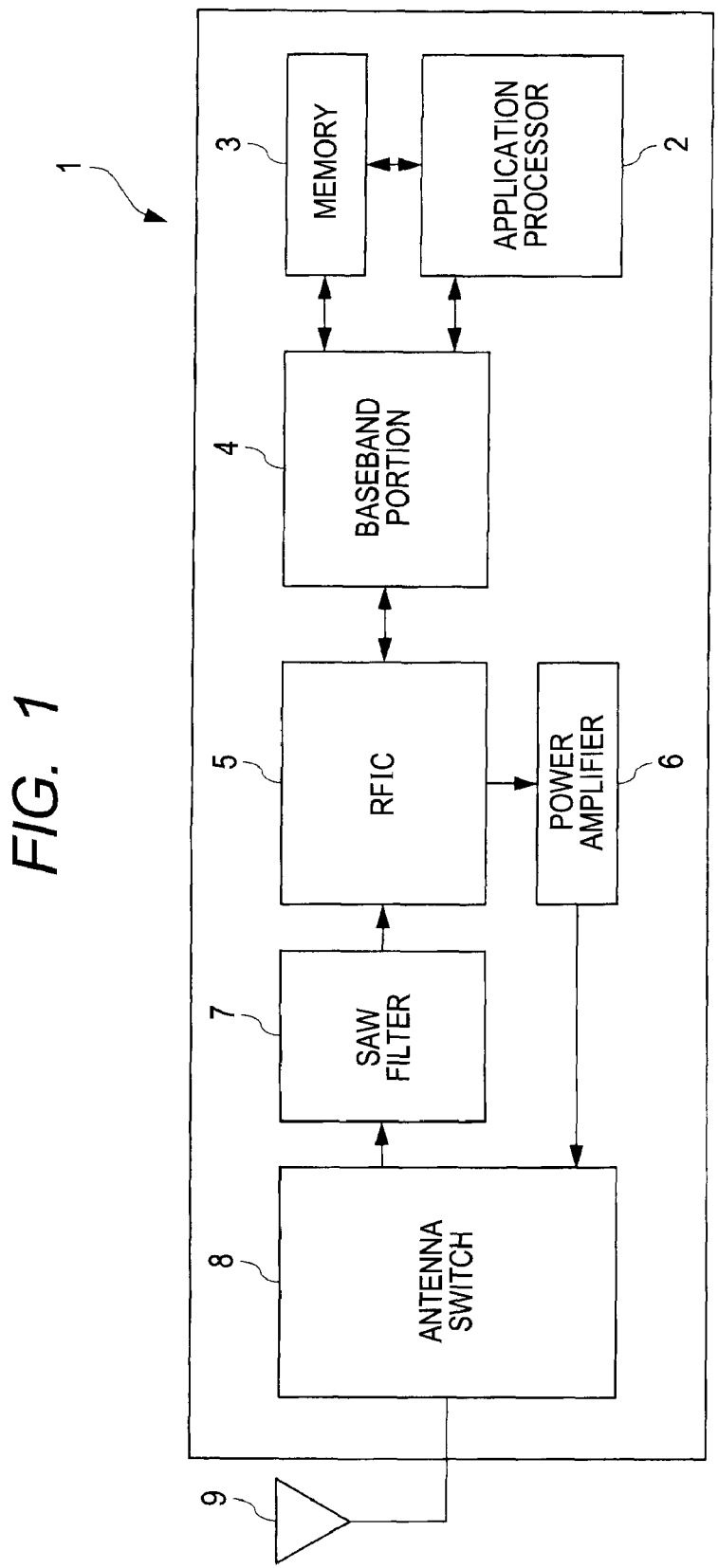
FIG. 1 is a block diagram showing the configuration of a transmission and reception unit of a cellular phone.

The following preferred embodiments may be divided into sections, or based on the respective embodiments, for convenience if necessary, but these embodiments are not irrelevant to each other except when specified otherwise. One of the embodiments has relationships with respect to the other, including a modified example of a part or all of the other, and a detailed or supplemental description of the other.

In the case of referring to a specific number (including the number, numeric value, amount, range, and the like) of components or the like in the following embodiments, the invention is not limited to the specific number except when specified otherwise, and except when apparently limited to the specific number in principle, and may be equal to or more than or less than the specific number.

It is apparent that in the embodiments below, the component (including a step or the like as a component) is not necessarily essential except when specified otherwise, and except when apparently determined to be essential in principle.

Likewise, in the following description of the embodiments, upon referring to the shape or positional relationship of the components, the shape or the like may include one substantially approximate or similar thereto, and the like except when specified otherwise, and unless otherwise specified in principle. The same goes for the above numeral value and range.

In all drawings for explaining the embodiments, the same or like part is designated by the same reference character, and a description thereof will not be repeated in principle. For easy understanding, some plan views are shown by hatching.

<Configuration of Transmission and Reception Unit>

FIG. 1 is a block diagram showing the configuration of a transmission and reception unit of a cellular phone. As shown in FIG. 1, a cellular phone 1 includes an application processor 2, a memory 3, a baseband portion 4, a RFIC 5, a power amplifier 6, a surface acoustic wave (SAW) filter 7, an antenna switch 8, and an antenna 9.

The application processor 2 is comprised of, for example, a central processing unit (CPU), and serves to achieve an application function of the cellular phone 1. Specifically, the processor 2 achieves the application function by reading and interpreting a command from the memory 3, and performing various computations and control processes based on the result interpreted. The memory 3 has a function of storing data. For example, the memory 3 stores therein a program for operating the application processor 2, and data processed by the application processor 2. The memory 3 can access not only the application processor 2, but also the baseband portion 4, and thus can be used to store therein data processed by the baseband portion 4.

The baseband portion 4 incorporates therein a CPU which is a central control unit. The baseband portion 4 can generate a baseband signal by digitally processing an audio signal (analogue signal) fed from a user (calling party) via an operating portion at time of transmission.

On the other hand, the baseband portion 4 can generate an audio signal from a baseband signal which is a digital signal at time of reception.

The RFIC 5 can generate a radio-frequency signal by modulating the baseband signal at time of transmission, and can generate a baseband signal by demodulating a received signal at time of receipt. The power amplifier 6 is a circuit that newly generates and outputs a signal with large power similar to a faint input signal by use of power supplied from a power source. The SAW filter 7 allows only a part of the received signal in a predetermined frequency band to pass therethrough.

The antenna switch 8 is to separate the received signal inputted to the cellular phone 1 from the transmitted signal outputted from the cellular phone 1. The antenna 9 is to transmit and receive radio waves.

The cellular phone 1 has the above configuration. The operation of the cellular phone 1 will be briefly described below. First, the case of transmitting a signal will be described. A baseband signal generated by digitally processing an analogue signal, such as an audio signal, by use of the baseband portion 4, is inputted to the RFIC 5. The RFIC 5 converts the input baseband signal into a radio-frequency (RF) signal by a modulation signal source and a mixer. The radio-frequency signal converted is outputted from the RFIC 5 to the power amplifier (PA module) 6. The radio-frequency signal inputted to the power amplifier 6 is amplified by the power amplifier 6, and then transmitted from the antenna 9 via the antenna switch 8.

Next, the case of receiving a signal will be described below. The radio-frequency signal (received signal) received by the antenna 9 is inputted to the RFIC 5 through the SAW filter 7. The RFIC 5 amplifies the received signal input thereto, and then subjected to frequency conversion by the modulation signal source and mixer. And, the signal whose frequency is converted is detected, whereby the baseband signal is extracted. Thereafter, the baseband signal is outputted from the RFIC 5 to the baseband portion 4. The baseband signal is processed by the baseband portion 4, whereby the audio signal is output therefrom.

As mentioned above, in the case where the digital cellular phone transmits the signal, the power amplifier 6 amplifies the signal, which is then outputted from the antenna 9 via the antenna switch 8.

<<Configuration of PA Module>>

Figure 2:
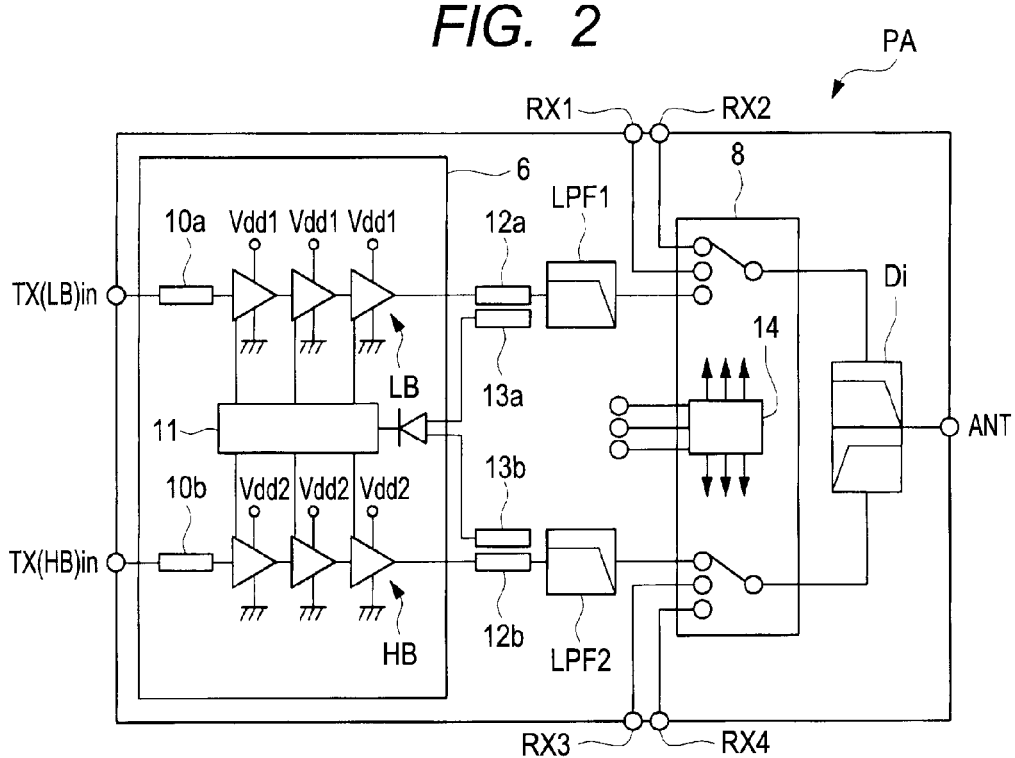
FIG. 2 is a diagram showing the configuration of circuit blocks of a PA module according to one embodiment of the present invention.

Now, the configuration of circuit blocks of the PA module PA will be described below. FIG. 2 is a diagram showing the configuration of circuit blocks of the PA module PA in one embodiment of the present invention. In FIG. 2, the PA module PA of this embodiment includes the power amplifier 6, output matching circuits 12a and 12b, detection circuits 13a and 13b, low-pass filters LPF1 and LPF2, the antenna switch 8, and a diplexer Di.

The power amplifier 6 is comprised of matching circuits 10a and 10b, amplifier circuits LB and HB, and a control circuit 11. The matching circuit 10a can effectively output an input signal (RF input) to be inputted to an input terminal TX (LB) of the PA module PA by suppressing the reflection of the input signal. The matching circuit 10a is formed of passive components, including, for example, an inductor, a capacitor element, a resistor element, and the like, which are assembled together so as to provide impedance matching respective to an input signal. The input signal inputted to the matching circuit 10a is a signal in a first frequency band. For example, the signal in the first frequency band is a signal using a global system for mobile communication (GSM) system. The signal in the first frequency band is a signal using a GSM low frequency band of 824 MHz to 915 MHz, or a GSM high frequency band of 1710 MHz to 1910 MHz.

The amplifier circuit LB is coupled to the matching circuit 10a. The amplifier circuit LB amplifies an input signal outputted from the matching circuit 10a. That is, the amplifier circuit LB is an amplifier for amplifying an input signal in the GSM low frequency band, and is comprised of, for example, three amplifier stages. In the amplifier circuit LB, the input signal in a GSM low frequency band outputted from the matching circuit 10a is first amplified on an initial amplifier stage. The input signal amplified on the initial amplifier stage is amplified on the intermediate amplifier stage, and then amplified on the last amplifier stage. The amplifier circuit LB can provide an amplified signal with large power similar to the faint input signal. The amplifier circuit LB having such functions supplies a power supply potential Vdd1 and a ground potential.

In this way, the power amplifier 6 includes the matching circuit 10a and the amplifier circuit LB for amplifying the input signal in the GSM low frequency band. Furthermore, the power amplifier 6 can also amplify an input signal in a GSM high frequency band of 1710 MHz to 1910 MHz. Specifically, the power amplifier 6 further includes the matching circuit 10b and the amplifier circuit HB.

The matching circuit 10b can effectively output an input signal (RF input) inputted from an input terminal TX (HB) in of the PA module PA to the amplifier circuit HB by suppressing the reflection of the input signal. The matching circuit 10b is comprised of passive components, including, for example, an inductor, a capacitor element, a resistor element, and the like, which are assembled together so as to provide impedance matching respective to the input signal. The input signal inputted to the matching circuit 10b is a signal in a second frequency band. For example, the signal in the second frequency band is a signal using a global system for the mobile communication (GSM). The signal in the first frequency signal is a signal using a GSM high frequency band of 1710 MHz to 1910 MHz. The matching circuit 10b is a matching circuit for a signal in the GSM high frequency band, and includes passive components having different numeral values from those of the above-mentioned matching circuit for a signal in the GSM low frequency band.

The amplifier circuit HB is coupled to the matching circuit 10b. The amplifier circuit HB amplifies an input signal outputted from the matching circuit 10b. That is, the amplifier circuit HB is an amplifier for amplifying an input signal in the GSM high frequency band, and is comprised of, for example, three amplifier stages. In the amplifier circuit HB, the input signal in a GSM high frequency band outputted from the matching circuit 10b is first amplified on an initial amplifier stage. The input signal amplified on the initial amplifier stage is amplified on the intermediate amplifier stage, and then amplified on the last amplifier stage. The amplifier circuit HB can provide an amplified signal with large power similar to the faint input signal. The amplifier circuit HB having such functions supplies a power supply potential Vdd2 and a ground potential. At this time, the power supply potential Vdd1 supplied to the amplifier circuit LB and the power supply potential Vdd2 supplied to the amplifier circuit HB are the same fixed potential which is higher than the ground potential.

As mentioned above, the power amplifier 6 of this embodiment can amplify the signals in different frequency bands, that is, the signal in the GSM low frequency band and the signal in the GSM high frequency band. The power amplifier 6 has the control circuit 11 for controlling the amplifier circuit LB for amplifying the signal in the GSM low frequency band, and the amplifier circuit HB for amplifying the signal in the GSM high frequency band. The control circuit 11 controls the amplification degree by applying a bias voltage to each of the amplifier circuit LB and the amplifier circuit HB according to a power supply (power supply voltage) and a control signal (power control voltage) inputted to the PA module PA.

In this way, the control circuit 11 controls the amplifier circuit LB and the amplifier circuit HB, but also carries out feedback control such that the amplification degree of the amplifier circuit LB and the amplification degree of the amplifier circuit HB are constant. The configuration of the feedback control will be apparent.

In order to achieve the feedback control, the output of the amplifier circuit LB for amplifying the signal in the GSM low frequency band is provided with a directional coupler (coupler) (not shown). The directional coupler can detect the power of the amplification signal amplified by the amplifier circuit LB. Specifically, the directional coupler is formed of a wiring serving as a main line, and another wiring serving as a sub line. The directional coupler detects the power of amplified signal proceeding through the main line, at the sub-line by electromagnetic junction.

The directional coupler is coupled to the detection circuit 13a. The detection circuit 13a converts the power detected by the directional coupler into voltage or current, and outputs a detection signal to the control circuit 11. In this way, the feedback control is achieved by the directional coupler and the detection circuit 13a. The control circuit 11 calculates a difference between the detection signal input from the detection circuit 13a and the control signal (power control voltage), and adjusts the bias voltage which is to be applied to the amplifier circuit LB so as to eliminate the calculated difference. Thus, the control circuit 11 performs control such that the amplification degree of the amplifier circuit LB is constant. Similarly, the output of the amplifier circuit HB for amplifying the signal in the GSM high frequency band is provided with the directional coupler (coupler) (not shown), and the directional coupler is coupled to the detection circuit 13b. The detection signal detected by the detection circuit 13b is inputted to the control circuit 11.

The output matching circuit 12a receives input of the amplification signal amplified by the amplification circuit LB included in the power amplifier 6, and provides impedance matching of the amplification signal. That is, the output matching circuit 12a has a function of effectively transmitting the amplification signal amplified by the amplifier circuit LB, and is comprised of passive components, including, for example, an inductor, a capacitor element, a resistor element, and the like. The output matching circuit 12a, to which the amplification signal amplified by the amplifier circuit LB is input, is a matching circuit for a signal in the GSM low frequency band.

The low-pass filter LPF1 is coupled to the output matching circuit 12a, and has a function of removing harmonic noise. For example, when the input signal is amplified by the amplifier circuit LB, the signal in the GSM low frequency band is amplified. At this time, the amplifier circuit LB also generates the harmonic having a frequency that is an integer multiple of the frequency of the signal in the GSM low frequency band. The harmonic is contained in the signal in the GSM low frequency band, and is a noise component having a frequency different from the amplified signal in the GSM low frequency band. Thus, the harmonic component needs to be removed from the amplified signal in the GSM low frequency band. This function is owned by the low-pass filter LPF1 coupled to the rear side of the output matching circuit 12a. The low pass filter LPF1 serves as a selection circuit for allowing a signal in a specific range of the frequency band among signals in a plurality of frequency bands to pass therethrough. That is, the low-pass filter LPF1 allows the amplified signal in the GSM low frequency band to pass therethrough, and attenuates a harmonic having a frequency higher than that of the amplified signal in the GSM low frequency band. The low-pass filter LPF1 can reduce the harmonic noise contained in the amplified signal in the GSM low frequency band.

Subsequently, the output of the amplifier circuit HB for generating an amplified signal in the GSM high frequency band is also coupled to the output matching circuit 12b and the low-pass filter LPF2. Specifically, the output matching circuit 12b receives input of the amplified signal amplified by the amplifier circuit HB included in the power amplifier 6, and provides the impedance matching of the amplified signal. That is, the output matching circuit 12b has a function of effectively transmitting the amplified signal amplified by the amplifier circuit HB, and is comprised of passive components, including, for example, an inductor, a capacitor element, a resistor element, and the like. The output matching circuit 12b, to which the amplified signal amplified by the amplifier circuit HB is input, is a matching circuit for a signal in the GSM high frequency band.

The low-pass filter LPF2 is coupled to the output matching circuit 12b, and has a function of removing harmonic noise. For example, when the input signal is amplified by the amplifier circuit HB, the signal in the GSM high frequency band is amplified. At this time, the amplifier circuit HB also generates the harmonic having a frequency that is an integer multiple of the frequency of the signal in the GSM high frequency band. The harmonic is contained in the signal in the GSM high frequency band, and is a noise component having a frequency different from the amplified signal in the GSM high frequency band. Thus, the harmonic component needs to be removed from the amplified signal in the GSM high frequency band. This function is owned by the low-pass filter LPF2 coupled to the rear side of the output matching circuit 12b. The low pass filter LPF2 serves as a selection circuit for allowing a signal in a specific range of the frequency band among signals in a plurality of frequency bands to pass therethrough. That is, the low-pass filter LPF2 allows the amplified signal in the GSM high frequency band to pass therethrough, and attenuates a harmonic having a frequency higher than that of the amplified signal in the GSM high frequency band. The low-pass filter LPF2 can reduce the harmonic noise contained in the amplified signal in the GSM high frequency band.

The antenna switch 8 is adapted to switch between lines coupled to the antenna ANT. The switching between the lines is performed by a selector switch. Specifically, the selector switch included in the antenna switch 8 switches between an output of the low-pass filter LPF1 and an output of the low-pass filter LPF2, and is coupled to the antenna ANT. That is, when the amplified signal in the GSM low frequency band outputted from the low-pass filter LPF1 intends to be outputted from the antenna ANT, the output of the low-pass filter LPF1 is switched to be coupled to the antenna ANT by the selector switch. On the other hand, when the amplified signal in the GSM high frequency band outputted from the low-pass filter LPF2 intends to be outputted from the antenna ANT, the output of the low-pass filter LPF2 is coupled to the antenna ANT by the selector switch. Thus, the antenna switch 8 can switch between outputs of two systems (transmission states), and can further switch between reception states. For example, in the reception state, the selector switch is operated to output a received signal received by the antenna to a receiving circuit. A plurality of receiving circuits exist, and the selector switch is provided which can switch among the receiving circuits. For example, receiving terminals RX1 to RX4 are provided for outputting received signals. The received signal received by the antenna ANT is outputted to the corresponding receiving circuit by switching using the antenna switch 8.

The control of the selector switch including the antenna switch 8 is performed by a decoder 14 formed in the antenna switch 8 based on a control signal from the baseband portion 4. The decoder 14 may be incorporated in a chip of the power amplifier 6. For example, whether the amplified signal (RF signal (in a low frequency band)) is output or not to the antenna ANT is controlled by on or off of the selector switch (switching element) formed in the antenna switch 8. Whether the received signal from the antenna is output or not to the receiving circuit is controlled by on or off of another selector switch (switching element) formed in the antenna switch 8. Likewise, whether the amplified signal (RF signal (in the high frequency band)) (not shown) is output or not to the antenna ANT is controlled by on or off of the selector switch (switching element) of the antenna switch 8.

Subsequently, the diplexer Di is a part that separates two different frequency bands into a low frequency band and a high frequency band, and is also called as an antenna duplexer, or branching filter. The use of the diplexer Di can separate signals in different frequency bands only through one antenna without additionally using an expensive antenna. In a transmission mode of the low frequency band and the high frequency band (in the case where large power outputted from the power amplifier 6 is transmitted from the antenna via the switch), one switch by which the large power from the power amplifier 6 is turned off is isolated by the diplexer Di. This configuration does not need any measures concerning the circuit so as to endure the large power, which advantageously simplify the configuration of the circuit.

<<Operation of PA Module>>

The PA module PA in this embodiment is configured as described above. Now, the operation of the PA module will be described below. As shown in FIG. 2, in this embodiment, the signal in the GSM low frequency band and the signal in the GSM high frequency band can be amplified. The amplifying operations of these signals are the same, and thus only the amplifying operation of the signal in the GSM low frequency band will be described below. The communication system described is the GSM system, but may be any other communication system.

As shown in FIG. 2, when a faint input signal (RF input) is inputted to the PA module PA, first, the matching circuit 10a receives input of the faint input signal. The matching circuit 10a provides impedance matching to the faint input signal, so that the input signal is effectively outputted to the amplifier circuit LB without being reflected. Subsequently, the input signal inputted to the amplifier circuit LB has a power amplified by three amplifier stages including the amplifier circuit LB. At this time, the amplification of the power by the amplifier circuit LB is controlled by the control circuit 11. Specifically, the control circuit 11 applies a bias voltage to the amplifier circuit LB based on a power supply (power supply voltage) and a control signal (power control voltage) inputted to the control circuit 11. The amplifier circuit LB amplifies the input signal based on the bias voltage from the control circuit 11 to output an amplified signal. Thus, the amplified signal amplified by the power amplifier 6 is output.

The amplified signal outputted from the power amplifier 6 has preferably a constant power. However, the power of the amplified signal actually output is not necessarily a desired power due to influences from outside. Feedback is given to the control circuit 11 for controlling the amplifier circuit LB. The operation of a feedback circuit will be described below.

The power of the amplified signal amplified by the amplifier circuit LB is detected by the directional coupler (coupler) (not shown). The power detected by the directional coupler is converted into voltage by the detection circuit 13a coupled to the directional coupler. A detection signal which is a voltage signal converted by the detection circuit 13a is inputted to the control circuit 11. On the other hand, the control circuit 11 receives input of a control signal (power control voltage) input from the outside of the PA module PA. The control circuit 11 calculates a difference between the detected signal converted into by the detection circuit 13a and the control signal input thereto from the outside of the PA module PA. Then, the control circuit 11 controls a bias voltage to be applied from the control circuit 11 to the amplifier circuit LB so as to eliminate the calculated difference. Thus, the power of the amplified signal amplified by the amplifier circuit LB becomes constant. This operation is an operation of the feedback circuit.

Subsequently, the amplified signal amplified by the amplifier circuit LB is inputted to the output matching circuit 12a. The matching circuit 12a provides impedance matching to the amplified signal, and thus the amplified signal is effectively outputted to the low-pass filter LPF1 without being reflected. Subsequently, a high-order harmonic contained in the amplified signal inputted to the low-pass filter LPF1 is removed by the low-pass filter LPF1. Thereafter, the amplified signal passing through the low-pass filter LPF1 is inputted to the antenna switch 8. At this time, the selector switch included in the antenna switch 8 is controlled based on a selector switch control signal transmitted from the baseband portion. In this case, the selector switch is controlled in such a manner that the low-pass filter LPF1 and the antenna ANT are electrically coupled to each other. Thus, the amplified signal outputted from the low-pass filter LPF1 is outputted to the diplexer Di via the selector switch in the On state, and then transmitted from the diplexer Di to the antenna ANT. As mentioned above, the amplified signal amplified by the PA module PA can be transmitted from the antenna ANT.

Next, the operation of capturing a signal received by the antenna ANT will be described below. The received signal by the antenna ANT is inputted to the antenna switch 8 via the diplexer Di. To capture the received signal inputted to the antenna switch 8, the selector switch is switched based on the selector switch control signal from the baseband portion. Specifically, the selector switch included in the antenna switch 8 is performed such that the antenna ANT is electrically coupled to the receiving circuit (not shown) provided outside the PA module PA. The received signal by the antenna ANT is inputted to the receiving circuit via the selector switch included in the antenna switch 8. And, the signal is processed by the receiving circuit. In this way, the received signal can be captured.

Figure 3:
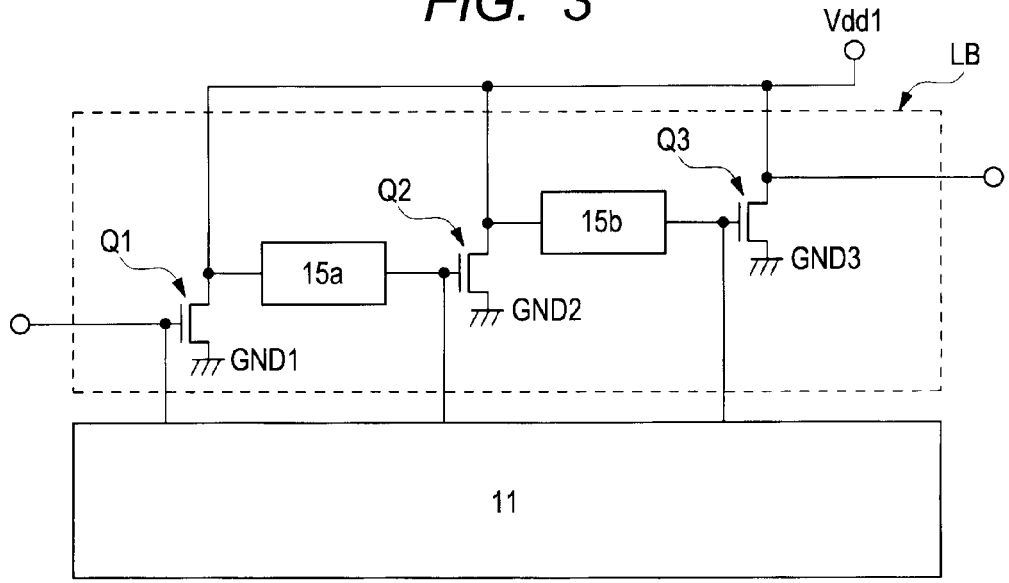
FIG. 3 is a diagram showing an example of the configuration of an amplifier circuit.

Subsequently, an example of the configuration of the amplifier circuit LB shown in FIG. 2 will be described below. FIG. 3 is a diagram showing the example of the configuration of the amplifier circuit LB. The amplifier circuit HB shown in FIG. 2, which is not shown in FIG. 3, has the same configuration as that of the amplifier circuit LB, and thus a description thereof will be omitted below.

As shown in FIG. 3, the amplifier circuit LB includes amplifier stages Q1 to Q3, each comprised of a MOSFET, and interstage matching circuits 15a and 15b. A gate electrode of the amplifier stage Q1 is coupled to the matching circuit 10a shown in FIG. 2, and a drain electrode of the amplifier stage Q1 is coupled to an input of the interstage matching circuit 15a. An output of the interstage matching circuit 15a is coupled to a gate electrode of the amplifier stage Q2, and a drain electrode of the amplifier stage Q2 is coupled to an input of the interstage matching circuit 15b. Further, an output of the interstage matching circuit 15b is coupled to a gate electrode of the amplifier stage Q3, and a drain electrode of the amplifier stage Q3 is coupled to the output matching circuit 12a shown in FIG. 2.

The drain electrodes of the amplifier stages Q1 to Q3 are coupled to the power supply potential Vdd1, and the source electrodes of the amplifier stages Q1 to Q3 are coupled to the ground potential. Specifically, the source electrode of the amplifier stage Q1 is coupled to the ground potential GND1, and the source electrode of the amplifier stage Q2 is coupled to the ground potential GND2. Likewise, the source electrode of the amplifier stage Q3 is coupled to the ground potential GND3. On the other hand, the gate electrodes of the amplifier stages Q1 to Q3 are coupled to the control circuit 11.

In the thus-configured amplifier circuit LB, the input signal outputted from the matching circuit 10a shown in FIG. 2 is inputted to the amplifier stage Q1. The amplifier stage Q1 amplifies the input signal based on a bias voltage from the control circuit 11, and outputs an amplified signal. Then, the signal amplified by the amplifier stage Q1 is inputted to the amplifier stage Q2 through the interstage matching circuit 15a. The amplifier stage Q2 amplifies and outputs the signal outputted from the amplifier stage A1 based on a bias voltage from the control circuit 11. Then, the signal amplified by the amplifier stage Q2 is inputted to the amplifier stage Q3 through the interstage matching circuit 15b. The amplifier stage Q3 amplifies and outputs the signal outputted from the amplifier stage Q2 based on a bias voltage from the control circuit 11. As mentioned above, the amplified signal provided by amplifying the input signal by the amplifier circuit LB with the amplifier stages Q1 to Q3 can be output from the amplifier circuit LB.

Now, the device structure of the power amplifier 6 included in the above PA module PA will be described below. The power amplifier 6 is formed, for example, in one semiconductor chip. In the semiconductor chip (or a surface layer part), semiconductor amplifying elements including the amplifier circuits LB and HB (for example, a metal insulator semiconductor field effect transistor (MISFET)), semiconductor elements including the control circuit 11, and passive elements including matching circuits (interstage matching circuits) 10a and 10b, and the like are formed. Thus, the PA module (electronic device) PA has the power amplifier 6, and the semiconductor chip has the semiconductor element including the power amplifier 6 and formed therein. The semiconductor chip is produced, for example, by forming a semiconductor integrated circuit on a semiconductor substrate (semiconductor wafer) formed of a monocrystalline silicon or the like, by backgrinding the semiconductor substrate as needed, and by separating the semiconductor substrate into respective semiconductor chips by dicing.

<<Structure of LDMOSFET>>

Figure 4:
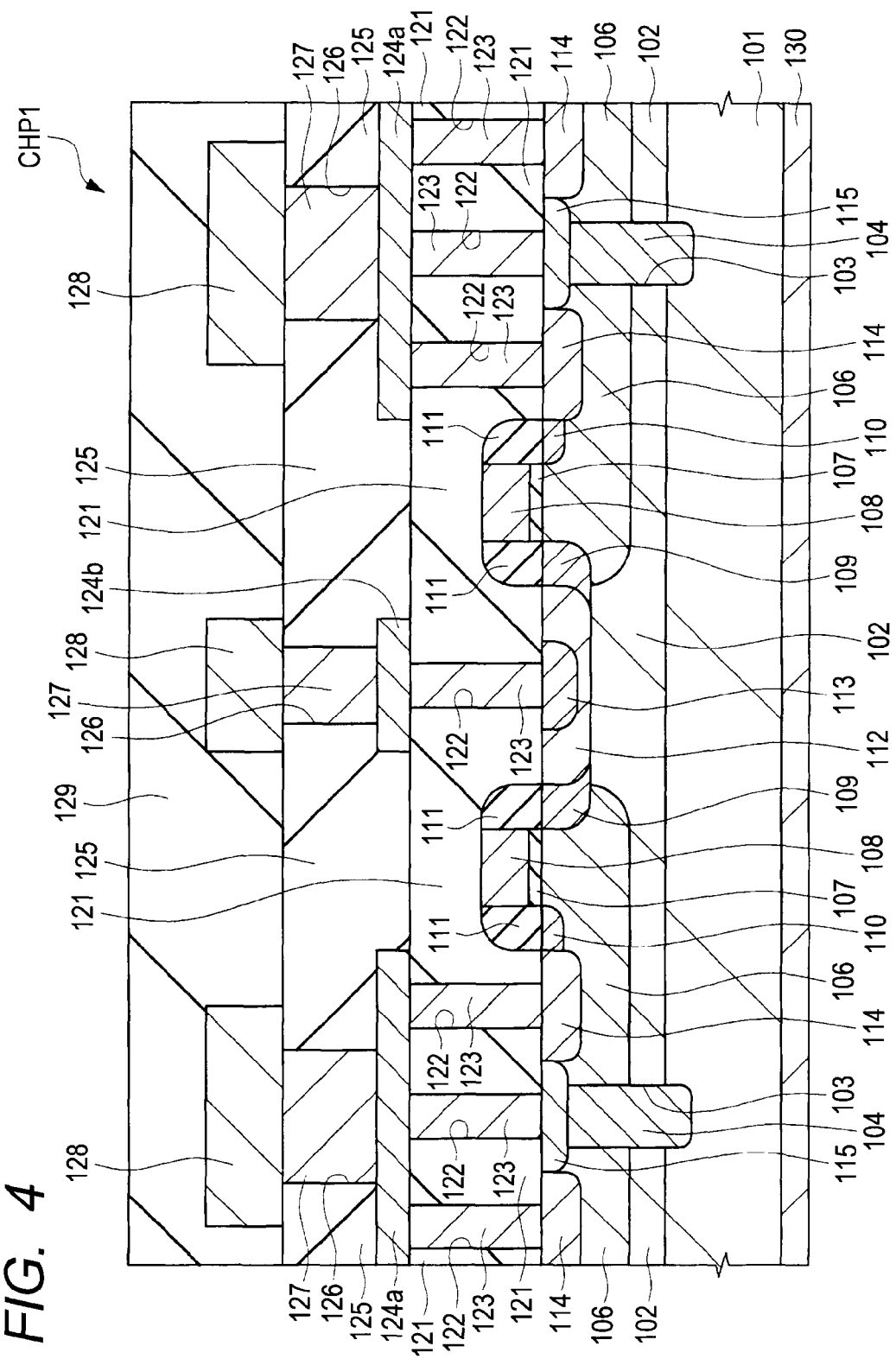
FIG. 4 is a cross-sectional view of a semiconductor chip when a semiconductor amplification element forming an amplifier circuit of a power amplifier is formed of a LDMOS-FET.

FIG. 4 is a cross-sectional view of a semiconductor chip CHP1 in one example where semiconductor amplifying elements including the amplifier circuits LB and HB of the power amplifier 6 each are comprised of a laterally diffused metal-oxide-semiconductor field effect transistor (LDMOSFET, laterally diffused MOSFET).

As shown in FIG. 4, an epitaxial layer 102 made of $p^-$-type monocrystalline silicon is formed over a main surface of a semiconductor substrate 101 made of $p^+$-type monocrystalline silicon. A p-type well 106 serving as a punch-through stopper for suppressing widening of a depletion layer from a drain region to a source region of the LDMOSFET is formed over a part of the epitaxial layer 102. On the surface of the p-type well 106, a gate electrode 108 of the LDMOWSFET is formed via a gate insulating film 107 made of a silicon oxide film or the like. The gate electrode 108 is comprised of, for example, an n-type polysilicon film, or a lamination of an n-type polysilicon film and a metal silicide film. A sidewall 111 made of a silicon oxide film or the like is formed on each side wall of the gate electrode 108.

A source region and a drain region of the LDMOSFET are formed in areas of the inside of the epitaxial layer 102 separated apart from each other with a channel formation region sandwiched therebetween. The drain region includes an $n^-$-type offset drain region 109 in contact with the channel formation region, an n-type offset drain region 112 formed in contact with the $n^-$-type offset drain region 109 and spaced apart from the channel formation region, and an n$^+$-type drain region 113 formed in contact with the n-type offset drain region 112 and further apart from the channel formation region. Among the n$^-$-type offset drain region 109, the n-type offset drain region 112, and n$^+$-type drain region 113, the n$^-$-type offset drain region 109 closest to the gate electrode 108 has the lowest concentration of impurities, and the n$^+$-type drain region 113 farthest from the gate electrode 108 has the highest concentration of impurities.

The source region of the LDMOSFET includes an n$^-$-type source region 110 in contact with the channel formation region, and an n$^+$-type source region 114 in contact with the n$^-$-type source region 100 formed apart from the channel formation region and having the higher concentration of impurities than that of the n$^-$-type source region 110. A p-type halo region (not shown) can also be formed under the n$^-$-type source region 110.

A p-type punched layer 104 in contact with the n$^+$-type source region 114 is formed at the end of the n$^+$-type source region 114 (at the end opposite to the side in contact with the n$^-$-type source region 110). A p$^+$-type semiconductor region 115 is formed near the surface of the p-type punched layer 104. The p-type punched layer 104 is a conductive layer for electrically coupling the source region of the LDMOSFET with the semiconductor substrate 101. The p-type punched layer 104 is formed of, for example, a p-type polysilicon film embedded in a slot 103 formed in the epitaxial layer 102.

Plugs 123 in contact holes 122 formed in the insulating film 121 (interlayer insulating film) are respectively coupled over the p-type punched layer 104 (p$^+$-type semiconductor region 115), the source region (n$^+$-type source region 114), and the drain region (n$^+$-type drain region 113) of the LDMOSFET. A source electrode 124a is coupled over the p-type punched layer 104 (p$^+$-type semiconductor region 115) and the source region (n$^+$-type source region 114) via the plugs 123, and a drain electrode 124b is coupled to the drain region (n$^+$-type drain region 113) via the plug 123.

Wirings 128 are respectively coupled to the source electrode 124a and the drain electrode 124b via plugs 127 in through holes 126 formed in an insulating film (interlayer insulating film) 125 covering the source electrode 124a and the drain electrode 124b. A passivation film (insulating film) 129 is formed of a lamination of a silicon oxide film and a silicon nitride film, over the wirings 128. Wirings 128 (and a metal film formed thereover) exposed from an opening formed in the passivation film 129 forms pad electrodes (bonding pads) (not shown). A back electrode (source back electrode) 130 is formed at the back surface of the semiconductor substrate 101.

<<Structure of HEMT>>

Next, the device structure of the antenna switch 8 included in the above-mentioned PA module PA will be described below. The antenna switch 8 is formed at, for example, one semiconductor chip. The antenna switch 8 is comprised of a transistor, for example, a high electron mobility transistor (HEMT) which is one kind of field-effect transistors. The device structure of the HEMT will be described below.

Figure 5:
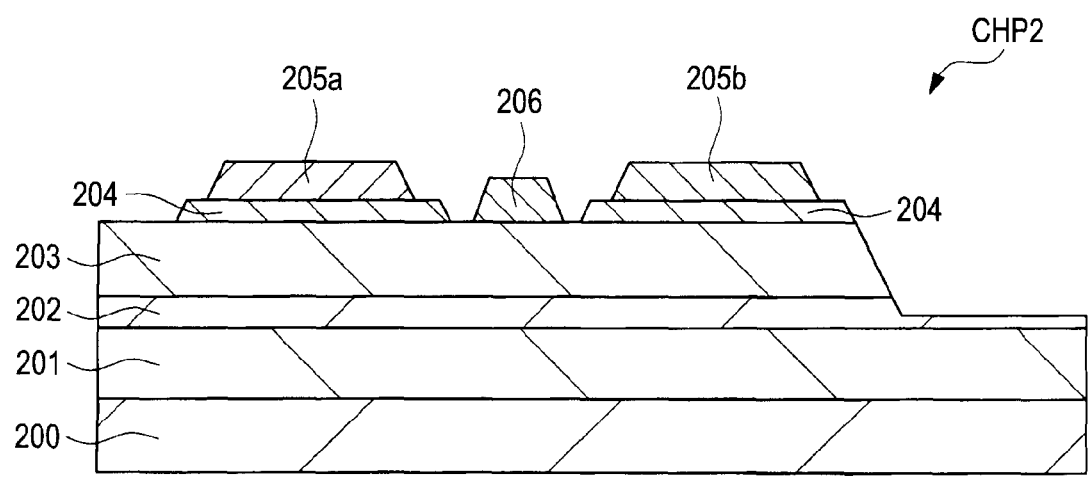
FIG. 5 is a cross-sectional view showing the structure of a HEMT formed in the semiconductor chip including an antenna switch.

FIG. 5 is a cross-sectional view showing the structure of the HEMT formed in the semiconductor chip 2 in this embodiment. As shown in FIG. 5, an epitaxial layer 201 is formed on a semi-insulating substrate 200. The semi-insulating substrate 200 is comprised of a GaAs substrate, which is a compound semiconductor, and will be described below. That is, the addition of one kind of impurities into the compound semiconductor having a large forbidden band width forms a deep level in the forbidden band. Electrons and holes in the deep level are fixed, while the density of electrons in the conduction band, or the density of the holes in a valence band becomes very small, so that the compound semiconductor comes close to an insulator. This kind of substrate is called as a "semi-insulating substrate". The deep potential is formed in the GaAs substrate by adding elements, such as Cr, In, or oxygen, or by excessively introducing arsenic thereinto, whereby the GaAs substrate becomes the semi-insulating substrate.

The epitaxial layer 201 formed on the semi-insulating substrate 200 is comprised of, for example, a GaAs layer. A buffer layer 202 is formed on the epitaxial layer 201, and an AlGaAs layer 203 is formed on the buffer layer 202. The AlGaAs layer 203 is processed in the form of mesa to isolate elements. A gate electrode 206 is formed on the AlGaAs layer 203. The gate electrode 206 in use is formed of a lamination of a metal layer of Pt (platinum) as the lowermost layer, a Pt layer, a Ti (titanium) layer, a Pt layer, and an Au (gold) layer in that order. Thus, the AlGaAs layer 203 and the gate electrode 206 (Pt layer as the lowermost layer) form schottky junction. Further, n-type GaAs layers 204 are formed apart from each other to sandwich the gate electrode 206 therebetween. Ohmic electrodes 205a and 205b are formed on the n-type GaAs layer 204. The Ohmic electrodes 205a and 205b are in ohmic contact with the n-type GaAs layer 204.

The above-mentioned high electron mobility transistor (HEMT) includes a lamination of the high-resistant epitaxial layer 201 (GaAs layer) and the AlGaAs layer 203 over the semi-insulating substrate (compound semiconductor substrate) 200, and uses a triangle square well potential generated at a heterojunction interface between the GaAs layer and the AlGaAs layer. The above-mentioned high electron mobility transistor (HEMT) includes the Schottky-barrier gate electrode 206 provided by forming a metal film on the surface of the AlGaAs layer 203. Further, the HEMT is provided with an ohmic source electrode (ohmic electrode 205a) and an ohmic drain electrode (ohmic electrode 205b) for allowing the current to pass through the heterojunction surface with the gate electrode 206 sandwiched therebetween.

The high electron mobility transistor (HEMT) uses a secondary electron gas formed in the square well potential as a carrier. The width of the square well potential existing at the heterojunction interface is substantially the same as a wavelength of electron. The electron can move only in a two-dimensional manner substantially along the interface. The transistor has the feature that a large mobility of electrons can be obtained. The HEMT has excellent high-frequency property and high-speed performance without any noise due to the large mobility of the secondary electron gas. Thus, the HEMT is used as an antenna switch that needs the high-speed performance.

<<Mounted Structure of PA Module>>

Figure 6:
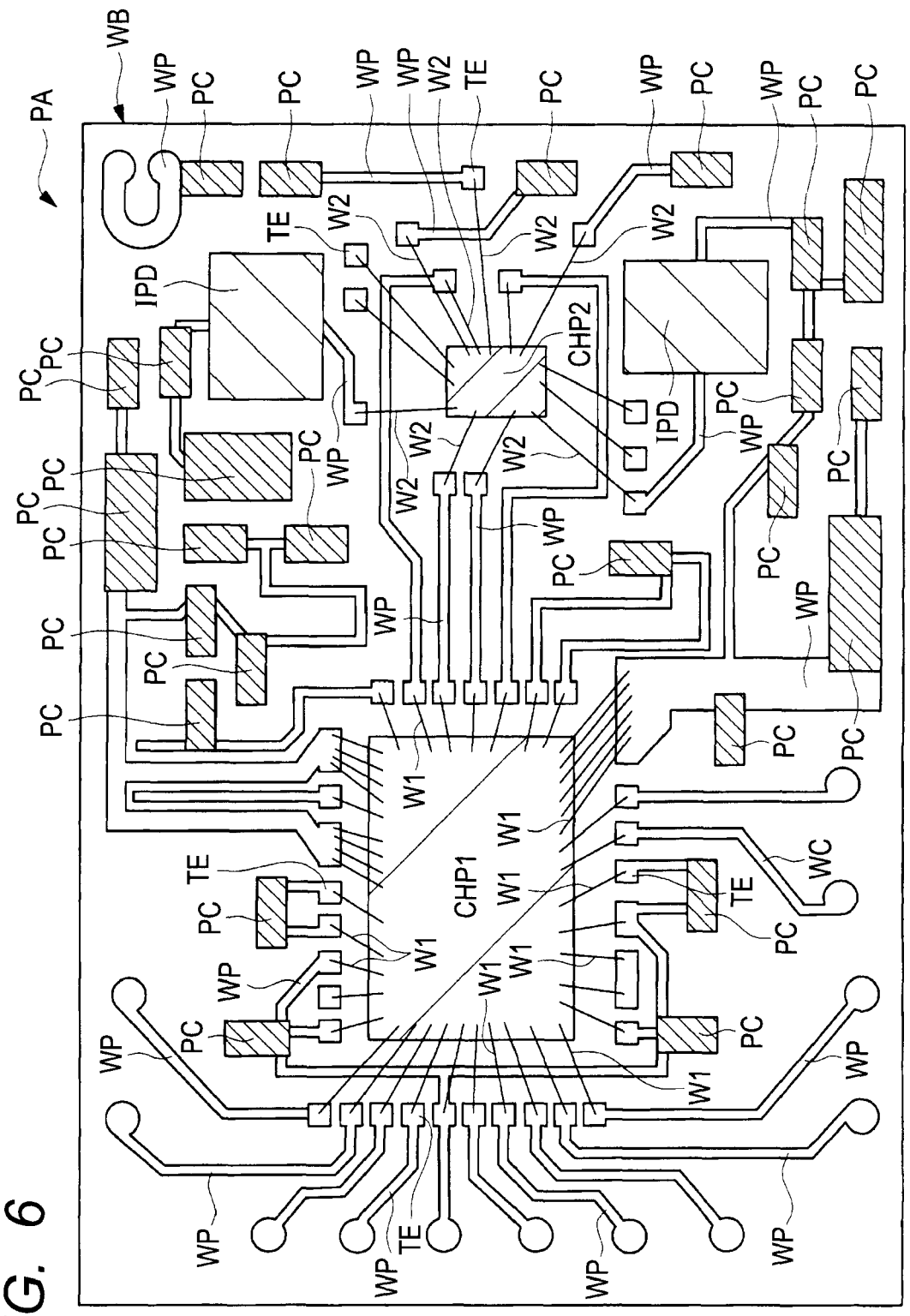
FIG. 6 is a plan view showing a mounting structure of the PA module in the embodiment.

Next, the mounted structure of the PA module PA in this embodiment will be described below. FIG. 6 is a plan view showing the mounted structure of the PA module PA in this embodiment. As shown in FIG. 6, the PA module PA in this embodiment has a semiconductor chip CHP1, a semiconductor chip CHP2, a passive component PC, and an integrated passive device IPD mounted over a wiring board WB. The semiconductor chip CHP1 is a semiconductor chip having the LDMOSFET (see FIG. 4) and the like formed therein and including the power amplifier 6 shown in FIG. 2. On the other hand, the semiconductor chip CHP2 is a semiconductor chip having the HEMT (see FIG. 5) and the like formed therein and including the antenna switch 8 shown in FIG. 2. The passive components PC are passive elements, for example, chip parts, including a resistance element (for example, a chip resistor), a capacitor element (for example, a chip capacitor), and an inductor element (for example, a chip inductor). The passive components PC are, for example, passive parts including the matching circuits 10a and 10b, and the output matching circuits 12a and 12b, as shown in FIG. 2. The integrated passive device IPD is an integrated passive element, including the low-pass filters LPF1 and LPF2 shown in FIG. 2. In the integrated passive device IPD, the inductor elements and the capacitor element, including the low-pass filters LPF1 and LPF2, are formed.

The semiconductor chip CHP1 mounted on the wiring board WB is coupled to terminals TEs via wires W1 formed at the wiring board WB. The terminal TE is electrically coupled to a wiring pattern WP. The terminals TEs are coupled to the passive component PC and the integrated passive device IPD via the wiring patterns WP. Likewise, the semiconductor chip CHP2 mounted on the wiring board WB is coupled to the terminals TE formed at the wiring board WB via wires W2. The terminal TE is electrically coupled to the wiring pattern WP. In this way, the semiconductor chip CHP1, semiconductor chip CHP2, passive component PC, and integrated passive device IPD are electrically coupled together via the wiring patterns WP.

The semiconductor chip CHP1 is comprised of, for example, silicon. The semiconductor chip CHP2 is comprised of, for example, a compound semiconductor substrate, such as a GaAs substrate. The passive components PCs include a resistance element using a polysilicon film, a capacitor element having a capacitive insulating film sandwiched between conductive films, an inductor element comprised of wiring, and the like. Also, the integrated passive devices IPDs include the capacitor element and the inductor element as described above. The terminal TE and the wiring pattern WP are formed of, for example, a copper film.

Figure 7:
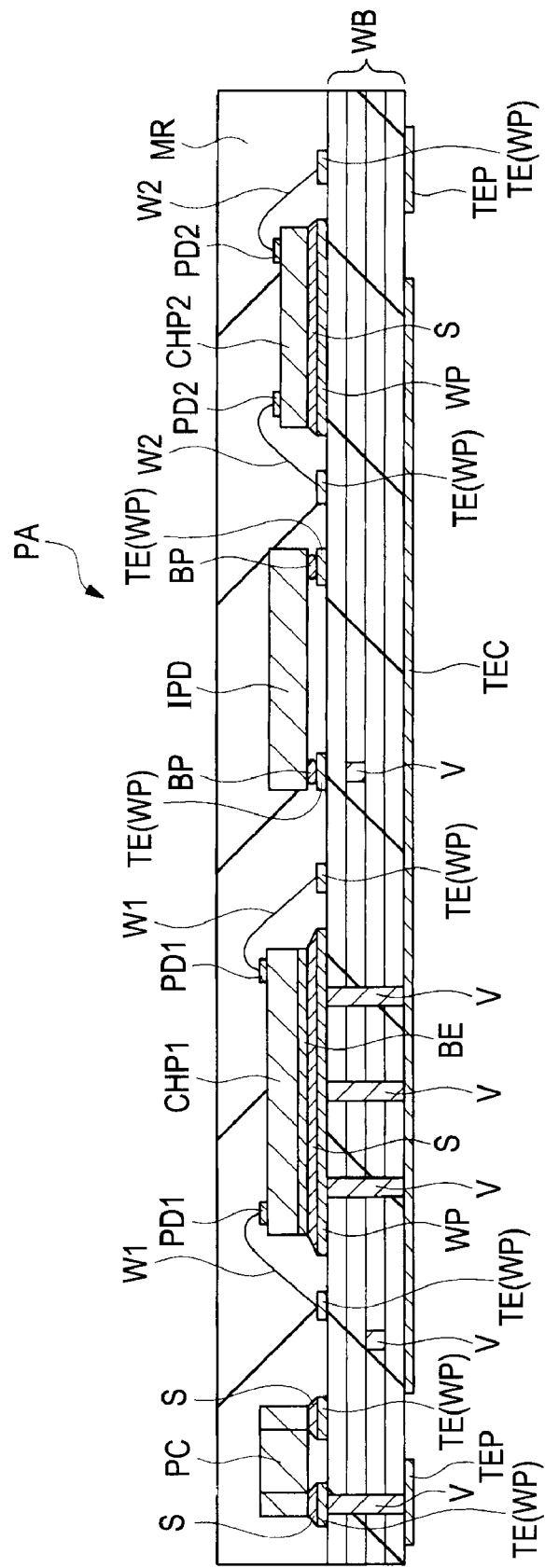
FIG. 7 is a cross-sectional view showing a mounting structure of the PA module in the embodiment.

Next, the cross-sectional structure of the PA module PA will be described below. FIG. 7 is a cross-sectional view showing the mounted structure of the PA module PA in this embodiment. FIG. 7 is not identical completely to the section taken in a predetermined position in FIG. 6.

In FIG. 7, the wiring board WB is a multilayer board provided by integrally laminating a plurality of insulating layers (dielectric layers), and a plurality of conductive layers or wiring layers (not shown). As shown in FIG. 7, four insulating layers are laminated to form a wiring board WB shown. The number of the insulating layers laminated is not limited thereto, and various modifications can be made to the number of the insulating layers. Suitable material for forming the insulating layer of the wiring board WB in use can be, for example, a PCB material, or a ceramic material, such as alumina (aluminum oxide, $Al_2O_3$). In this case, the wiring board WB is a PCB board, or a ceramic multilayer board. Suitable material for the insulating layer of the wiring board WB is not limited to the PCB material or ceramic material, and various modifications can be made to the material. For example, a glass epoxy resin or the like may be used.

Conductor patterns for formation of wirings are formed on the upper side (surface, main surface) of the wiring board WB, on the lower side (back surface) thereof, and between the insulating layers. The conductor pattern positioned on the uppermost layer of the wiring board WB forms a wiring pattern WP on the upper side of the wiring board WB (including the terminal TE). The conductor pattern positioned on the lowermost layer of the wiring board WB forms a back terminal TEC and a back terminal TEP on the lower surface of the wiring board WB.

The terminal TE on the upper surface of the wiring board WB is formed by a part of the wiring pattern WP. The terminals TEs are parts of the wiring patterns WP on the upper surface of the wiring board WB that are electrically coupled to the pads PD1 and PD2 of the semiconductor chips CHP1 and CHP2 via the wires W1 and W2, or parts of the wiring patterns WP on the upper surface of the wiring board WB that are coupled to the passive component PC or electrode of the integrated passive device IPD. The back terminal TEC and the back terminal TEP are formed on the back surface of the wiring board WB, and correspond to the external joining terminal. That is, the wiring board WB included in the PA module PA is mounted over a mounting board (motherboard) by the back terminal TEC and the back terminals TEPs formed at the back surface of the wiring board WB. The conductor patterns are also formed inside the wiring board WB, that is, between the insulating layers. However, for simplification, the illustration of these patterns is omitted in FIG. 7.

The respective conductor patterns (wiring layers) included in the wiring board WB are electrically coupled to each other through conductors or conductive films in via holes (through holes) formed in the insulating layer as needed. Thus, the terminals TEs formed at the upper surface of the wiring board WB are electrically coupled to the back terminal TEC and the back terminal TEP formed at the lower surface of the wiring board WB via the wiring pattern WP formed at the upper surface of the wiring board WB, the conductor pattern (wiring layer between the insulating layers) formed inside the wiring board WB, and the conductive film in the via hole, as needed. Among the via holes Vs, the via hole V provided under the semiconductor chip CHP1 serves as a thermal via for dissipating heat generated in the semiconductor chip CHP1 or the like from the back surface of the wiring board WB. That is, the semiconductor chip CHP1 is coupled to the back terminal TEC formed in the center of the back surface of the wiring board WB through the via penetrating the wiring board WB (which is formed of a conductive film in the via hole V). The heat generated in the semiconductor chip CHP1 is transferred to the back terminal TEC formed at the back surface of the wiring board WB via the via and then dissipated from the back terminal TEC. As mentioned above, the back terminal TEC also has a function of dissipating the heat generated in the semiconductor chip CHP1.

The passive component PC, the semiconductor chip CHP1, the integrated passive device IPD, and the semiconductor chip CHP2 are mounted over the upper surface of the wiring board WB. The passive component PC is electrically coupled to the terminal TE formed at the upper surface of the wiring board WB via solder S. Likewise, the semiconductor chip CHP1 is electrically coupled to the back electrode BE formed at the back surface of the semiconductor chip CHP1 and the wiring pattern WP formed at the upper surface of the wiring board WB via the solder S. On the other hand, the pad PD1 formed at the surface of the semiconductor chip CHP1 is electrically coupled to the terminal TE formed at the wiring board WB via the wire W1. Further, the integrated passive device IPD is electrically coupled to the terminal TE formed at the upper surface of the wiring board WB by a bump electrode BP. The semiconductor chip CHP2 is electrically coupled to the wiring pattern WP formed at the upper surface of the wiring board WB via the solder S. On the other hand, the pad PD2 formed at the surface of the semiconductor chip CHP2 is electrically coupled to the terminal TE formed at the wiring board WB via the wire W2.

A resin member MR is formed to cover the passive component PC, the semiconductor chip CHP1, the integrated passive device IPD, and the semiconductor chip CHP 2 mounted over the wiring board WB.

<<Structure of Back Surface of PA Module>>

The PA module PA of this embodiment is mounted as described above. The arrangement of the back terminal TEC and the back terminal TEP formed at the back surface of the PA module PA will be described below. The PA module PA of this embodiment has the following feature about the layout structure of the back terminal TEC and the back terminal TEP formed at the back surface (the surface opposite to a chip mounting surface) of the wiring board WB included in the PA module PA. First, before the feature is explained, a layout pattern of the back terminal TEC and the back terminal TEP at the back surface of the normal PA module PA will be described below. Then, after the problem about the layout pattern is explained, the layout structure of the PA module PA of this embodiment will be described later.

Figure 8:
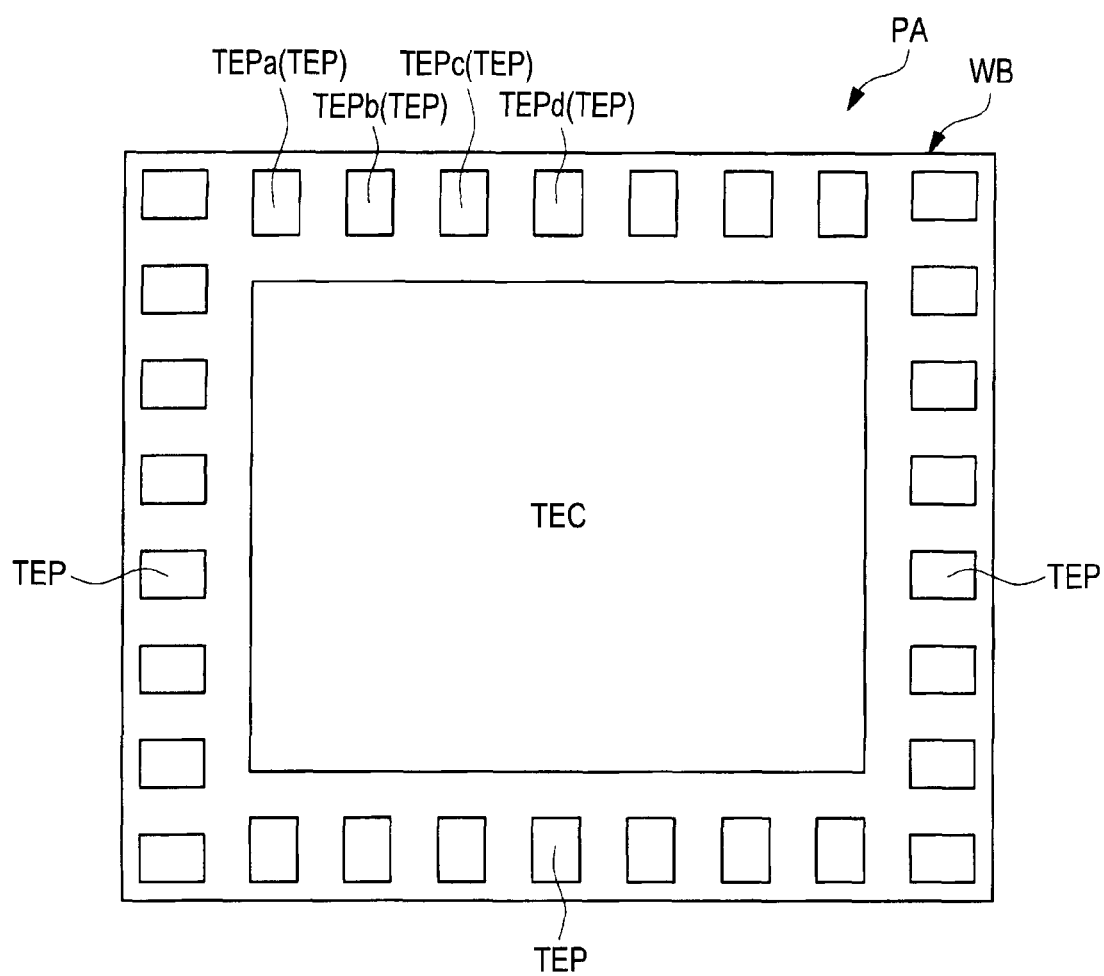
FIG. 8 is a diagram showing a layout structure of a back surface of a normal PA module.

FIG. 8 is a diagram showing a layout structure of a back surface of a normal PA module PA. As shown in FIG. 8, the PA module PA includes the rectangular wiring board WB, and the back terminal TEC and the back terminals TEPs are formed at the back surface of the wiring board WB. Specifically, the rectangular back terminal TEC is formed in the center of the back surface of the wiring board WB. The rectangular back terminals TEPs are formed around the perimeter of the wiring board WB surrounding the back terminal TEC. The back terminal TEC formed in the center of the wiring board WB is larger than each of the back terminals TEPs formed around the perimeter of the wiring board WB. The back terminal TEC serves as a terminal for a first reference potential to which a reference potential (for example, a ground potential) is applied. The back terminal TEC supplying the ground potential is coupled to the semiconductor chip CHP1 or the like mounted over the surface (main surface) of the wiring board WB through the via holes, and thus has a function of effectively dissipating heat generated at the semiconductor chip CHP1. Thus, the back terminal TEC formed in the center of the wiring board WB is large in area so as to improve an effect of heat dissipation.

The back terminals TEPs formed around the perimeter of the wiring board WB include a terminal for signal, a terminal for a power supply potential, and a terminal for a reference potential (terminal for a second reference potential). That is, the back terminals TEPs include a plurality of terminals to which different potentials are applied.

For example, as shown in FIG. 8, the back terminals TEPa to TEPd will be taken as one example of the adjacent back terminals TEP among the back terminals TEPs arranged around the perimeter of the wiring board WB. In this case, for example, the back terminal TEPa (terminal for a second reference potential) and the back terminal TEPb (terminal for a third reference potential) are terminals to each of which the ground potential is applied. The back terminal TEPc and the back terminal TEPd are terminals to which a signal passing through any one of the input terminal TX(LB) in, the input terminal Tx(HB) in, the receiving terminals RX1 to RX4, and the antenna ANT is applied.

Figure 9:
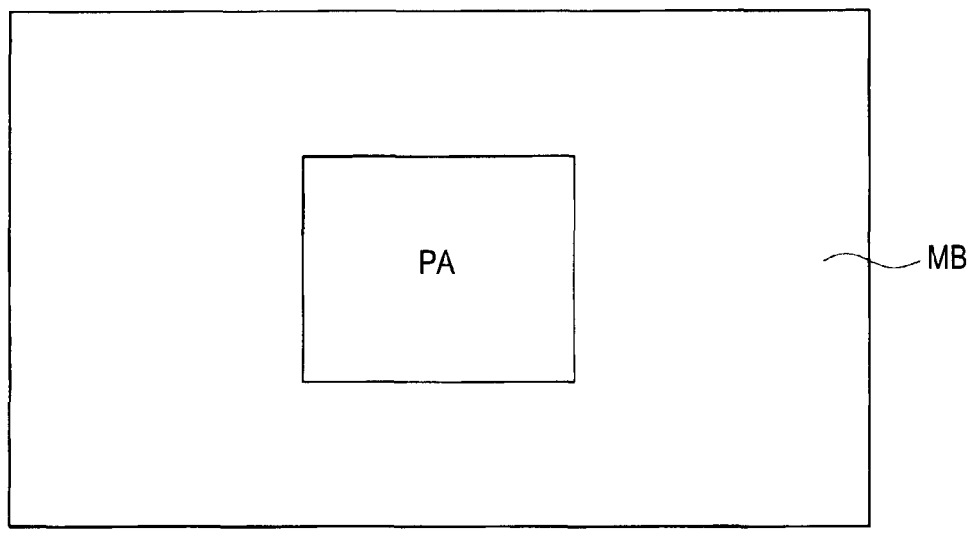
FIG. 9 is an exemplary plan view showing a state of the PA module mounted on a mounting board.

The back layout of the normal PA module PA is configured as described above, and the PA module PA is mounted on the mounting board such that the back terminal TEC and the back terminals TEPs formed at the back surface of the wiring board WB are in contact with the electrodes formed at the mounting board (motherboard). FIG. 9 is an exemplary diagram showing a state of the PA module PA mounted over the mounting board WB.

Figure 10:
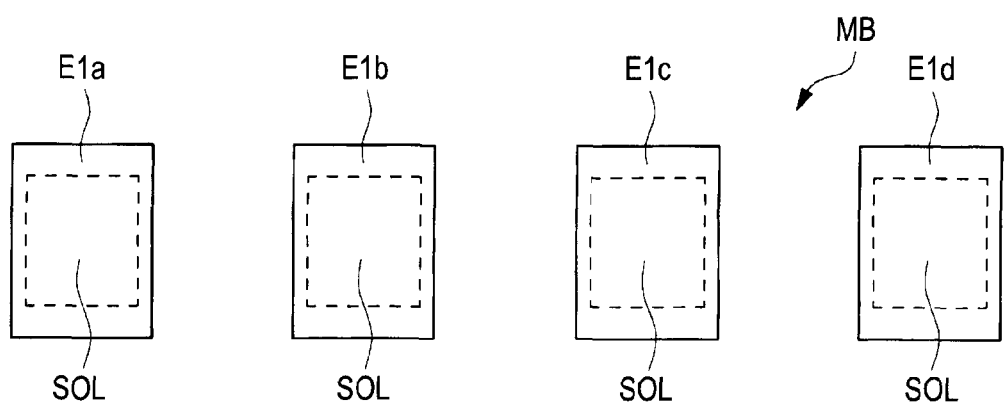
FIG. 10 is a diagram showing parts of electrodes formed on the mounting board.

The detailed description of the mounted structure of the PA module PA on the mounting board will be given below by taking as an example, the case where the back terminals TEPa to TEPd formed at the back surface of the PA module PA are coupled to the electrodes formed at the mounting board MB. FIG. 10 shows the arrangement of the electrodes at the mounting board MB corresponding to the back terminals TEPa to TEPd formed at the back surface of the PA module PA shown in FIG. 8. As shown in FIG. 10, electrodes E1$a$ to E1$d$ which are some of the electrodes formed at the mounting board MB are illustrated. The electrodes E1$a$ to E1$d$ are arranged over the mounting board MB with a predetermined clearance therebetween. The electrodes E1$a$ to E1$d$ formed over the mounting board MB are respectively coupled to the back terminals TEPa to TEPd formed at the back surface of the PA module shown in FIG. 8. In actually mounting the PA module PA over the mounting board MB, as shown in FIG. 10, solder SOL is formed on each of the electrodes E1$a$ to E1$d$ formed at the mounting board MB.

Figure 11:
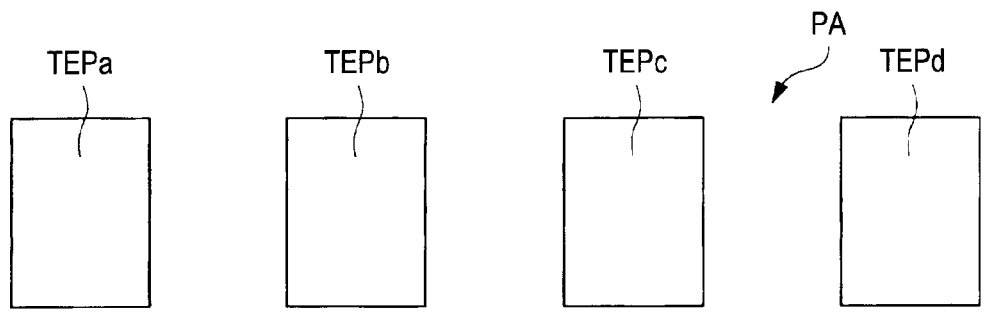
FIG. 11 is a diagram showing back terminals formed on the normal PA module.

On the other hand, FIG. 11 shows the back terminals TEPa to TEPd formed at the PA module PA. As can be seen from FIGS. 10 and 11, the electrodes E1$a$ to E1$d$ shown in FIG. 10 respectively correspond to the back terminals TEPa to TEPd shown in FIG. 11.

Figure 12:
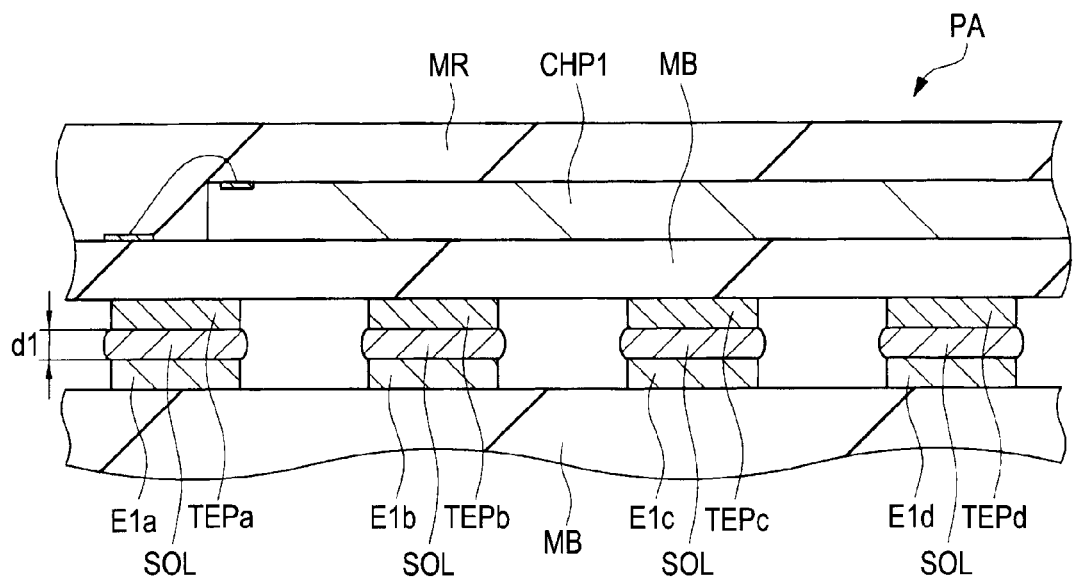
FIG. 12 is a cross-sectional view of the normal PA module mounted on the mounting board.

FIG. 12 is a cross-sectional view of the PA module PA mounted over the mounting board MB. As shown in FIG. 12, the back terminals TEPa to TEPd formed at the PA module PA are respectively electrically coupled to the electrodes E1$a$ to E1$d$ formed at the mounting board MB via the solder SOL. Specifically, after forming the solder SOL on the electrodes E1$a$ to E1$d$ formed at the mounting board MB by solder printing or the like, the PA module PA is arranged over the mounting board MB such that the back terminals TEPa to TEPd of the PA module PA are opposed to the electrodes E1$a$ to E1$d$. The back terminals TEPa to TEPd are bonded to the electrodes E1$a$ to E1$d$ via the solder SOL by applying a reflow process (heat treatment) to the mounting board MB with the PA module PA mounted to melt the solder SOL. At this time, each of the back terminals TEPa to TEPd has the same area as that of the electrodes E1$a$ to E1$d$. The thickness of the solder SOL formed between the back terminal TEPa and the electrode E1$a$, between the back terminal TEPb and the electrode E1$b$, between the back terminal TEPc and the electrode E1$c$, and between the back terminal TEPd and the electrode E1$d$ is a uniform thickness d1. Thus, the reliability of coupling between the PA module PA and the mounting board MB can be ensured. That is, the thickness of the solder SOL formed between each of the back terminals TEPa to TEPd and each of the electrodes E1$a$ to E1$d$ can be made uniform. The flatness of the surface of the PA module PA and the surface of the mounting board MB can be ensured. As a result, the coupling between the PA module PA and the mounting board MB can be surely obtained. Thus, the back layout of the normal PA module as shown in FIG. 8 can ensure the reliability of coupling between the PA module PA and the mounting board MB, but has the following other problems.

In the normal PA module PA shown in FIG. 8, a plurality of terminals for supplying a reference potential (ground potential) exist at the back surface of the wiring board WB. This is based on the reasons below. As shown in FIG. 2, for example, the ground potential needs to be supplied to amplification stages (circuit elements) of the amplifier circuit LB and the amplifier circuit HB in the power amplifier 6, and for example, the back terminals TEC and TEPa and TEPb are formed to supply the reference potential (ground potential) so as to be coupled to the circuit elements. That is, in the general PA module PA shown in FIG. 8, the reference potential (ground potential) is independently supplied to each circuit element included in the PA moduled PA. For example, a terminal for supplying the ground potential GND1 as shown in FIG. 3 corresponds to the back terminal TEC, a terminal for supplying the ground potential GND2 corresponds to the back terminal TEPa, and a terminal for supplying the ground potential GND3 corresponds to the back terminal TEPb.

When the back terminals TEC, TEPa, and TEPb for electrically independently supplying the reference potential (ground potential) are formed, the ground potential supplied from each of the back terminal TEC, TEPa, and TEPb tends to be unstable. That is, the ground potential applied to each of the back terminals TEC, TEPa, and TEPb may be easily changed due to noise or the like. When the ground potential applied to the back terminals TEC, TEPa, and TEPb fluctuates and becomes unstable, for example, the amplifier circuits LB and HB shown in FIG. 2 are not operated normally and oscillate. That is, in the normal PA module PA, the back terminals TEC, TEPa, and TEPb for supplying the reference potential (ground potential) are independently arranged. The independent arrangement of the back terminals TEC, TEPa, and TEPb obviously poses a problem of degradation of electric properties of the PA module PA.

In other words, the ground potential is supplied from the mounting board (motherboard) to the PA module PA, and further, to the amplifier circuit LB and the amplifier circuit HB (see FIG. 2) formed in the semiconductor chip via the terminals (back terminals TEC, TEPa, and TEPb) of the PA module PA. It is desirable that the ground potential supplied from the mounting board is stably supplied to the amplifier circuits LB and HB as it is. When the ground potential is supplied from each of terminals which are electrically isolated from each other over the wiring board WB existing between the mounting board and the semiconductor chip (for example, TEC, TEPa, and TEPb), the ground potential supplied from the mounting board to the semiconductor chip (amplifier circuit LB and amplifier circuit HB) via the wiring board WB further becomes more unstable. When the ground potential becomes more unstable in this way, the respective ground potentials at the semiconductor chip (of the amplifier circuit LB, and the amplifier circuit HB) are not the same (in a state where some of the ground potentials are floating). As a result, a difference in ground potential at the semiconductor chip (between the amplifier circuit LB and the amplifier circuit HB) allows a current to flow therethrough, which causes an oscillation phenomenon in the amplifier circuit LB and the amplifier circuit HB. The phrase "more unstable state of each ground potential" means that a resistance coupling between the respective ground potentials is unignorable and the respective ground potentials are not the same (in a state where some of the ground potentials are floating). The inventors have found that the phenomenon of degradation in stability of the respective ground potentials tends to be easily caused because the respective ground potentials are electrically isolated from each other.

As mentioned above, when the ground potential is supplied to the semiconductor chip from the mounting board via the wiring board WB, the oscillation phenomenon at the amplifier circuits LB and HB due to the unstable ground potential is obviously exhibited in the following case. That is, the ground potential is divided into and supplied to the respective amplifier stages of the amplifier circuits LB and HB in the semiconductor chip, and the ground potentials are supplied from the respective terminals electrically isolated even on the wiring board WB into the semiconductor chip. Even in the case where the ground potential to be supplied to each amplifier stage of the amplifier circuit LB or amplifier circuit HB is shared in the semiconductor chip, when each ground potential is supplied from each of different terminals electrically isolated even over the wiring board WB into the semiconductor chip, the following problem will occur. That is, the stability of the ground potential is reduced, and the oscillation phenomenon of the amplifier circuit LB and amplifier circuit HB occurs due to the instability of the ground potential. That is, regardless of the presence or absence of commonality of the ground potentials in the semiconductor chip, when the ground potential is supplied into the semiconductor chip from each of the different terminals electrically isolated at the wiring board WB, the electrical properties of the PA module PA may be degraded.

Electrical coupling of the back terminals TEC, TEPa, and TEPb formed on the wiring board WB as an independent pattern is established so as to stably supply the reference potential (ground potential). That is, by electrically coupling the back terminals TEC, TEPa, and TEPb to achieve commonality thereof, the fluctuations of the ground potential is suppressed, so that the stable ground potential can be supplied. The studies by the inventors have apparently shown that the stable ground potential with a small fluctuations of voltage can be supplied by electrically coupling the back terminals TEC, TEPa, and TEPb to which the reference potential (ground potential) is applied, whereby the electrical properties of the PA module PA can be improved. For example, in the example where the electrical properties of the PA module PA are improved, the back terminals TEC, TEPa, and TEPb are electrically coupled to thereby improve the stability of the ground potential. As a result, the stable ground potential with small fluctuations can be supplied to the amplifier circuits LB and HB shown in FIG. 2, so that the oscillation phenomenon at the amplifier circuits LB and HB can be suppressed.

As mentioned above, the layout of the back surface of the normal PA module PA shown in FIG. 8 is not sufficient from the viewpoint of improving the electric properties of the PA module PA. The back surface layout of the PA module PA is found to be susceptible to improvement so as to enhance the electric properties of the PA module PA. For this reason, measures for achieving the commonality of the terminals for applying the ground potential is to improve the electric properties of the PA module PA. In this case, there are proposed a technical idea for electrically coupling the terminals (terminals for supplying the ground potential) formed at the back surface of the PA module PA, and another technical idea for electrically coupling the electrodes formed at the mounting board MB with the PA module PA mounted thereover (electrodes to which the ground potential is applied).

It is desirable that the electric properties of the PA module PA is improved without changing the electrode pattern formed at the mounting board MB.

The following will described the achievement of the technical idea for electrically coupling the terminals (terminals for supplying the ground potential) formed at the back surface of the PA module PA from the viewpoint of improving the electric properties of the PA module PA. The electric coupling of the terminals (terminals for supplying the ground potential) formed at the back surface of the PA module PA without changing the electrode patterns formed at the mounting board MB leads to the following inconvenience, which will be described below by use of comparative examples.

Figure 13:
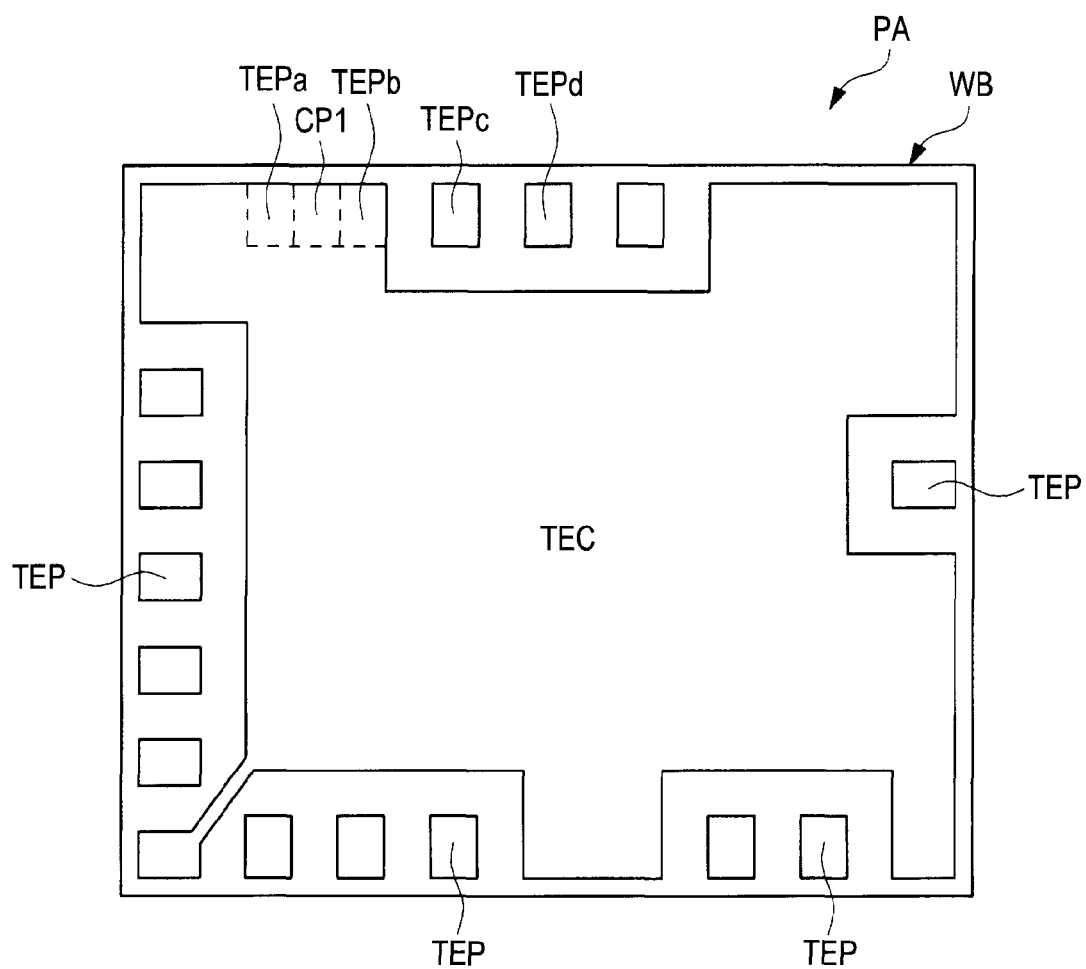
FIG. 13 is a diagram showing a layout structure of a back surface of a PA module in a comparative example.

FIG. 13 is a plan view showing the back surface layout of the PA module PA in the comparative example. As shown in FIG. 13, the wiring board WB included in the PA module PA has on its back surface, the back terminal with a large area, and the back terminals TEPs formed around the back terminal TEC. The back terminal TEC is a terminal to which the ground potential is applied (terminal for a first reference potential). The back terminals TEPs includes a signal terminal to which a signal is applied, a terminal for a power supply potential to which a power supply voltage is applied, and a terminal for a reference potential to which a reference potential (ground potential) is applied. Specifically, among the back terminals TEPs, for example, as shown in FIG. 13, the back terminals TEPa to TEPd are arranged. At this time, the back terminal TEPa (terminal for a second reference potential) and the back terminal TEPb (terminal for a third reference potential) are terminals to which the ground potential is applied. The back terminal TEPc and the back terminal TEPd are terminals for signals to which signals are applied. Referring to FIG. 13, the back terminals TEPa and TEPb to which the ground potential is applied are integrally formed with the back terminal TEC formed in the center of the wiring board WB. That is, the back terminal TEC is electrically coupled to the back terminal TEPa, and the back terminal TEPb. As shown in FIG. 13, the back terminal TEPa and the back terminal TEPb are integrally formed with the back terminal TEC. The shapes of the back terminal TEPa and the back terminal TEPb are represented by a dotted line for easy understanding. The back terminal TEPa and the back terminal TEPb represented by the dotted line can be coupled together by the back conductor pattern CP1.

As mentioned above, in the PA module PA of the comparative example, the back terminal TEC, the back terminal TEPa, and the back terminal TEPb which are adapted for applying the ground potential are electrically coupled together, and thus can suppress fluctuations in ground potential and supply the stable ground potential. That is, the back terminals TEC, TEPa, and TEPb for applying the reference potential (ground potential) are electrically coupled together, so that the stable ground potential with small fluctuations in voltage can be supplied thereby to improve the electric properties of the PA module PA.

The above comparative example, however, may have a problem of reduction of the reliability of coupling in mounting the PA module PA at the mounting board MB. This problem will be described below.

Figure 14:
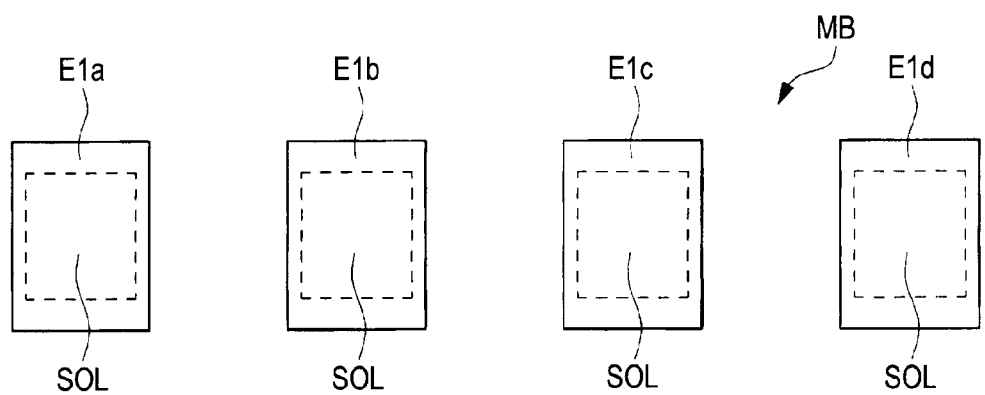
FIG. 14 is a diagram showing parts of the electrodes formed on the mounting board.

The details of the structure including the PA module PA mounted over the mounting board in the comparative example will be described by taking as an example the case of coupling the back terminals TEPa to TEPd formed at the back surface of the PA module PA to the electrodes formed at the mounting board MB. FIG. 14 shows the arrangement of electrodes formed at the mounting board MB corresponding to the back terminals TEPa to TEPd formed at the back surface of the PA module PA shown in FIG. 13. FIG. 14 shows electrodes E1a to E1d, which are parts of the electrodes formed at the mounting board MB. The electrodes E1a to E1d are arranged over the mounting board MB with a predetermined clearance therebetween. The electrodes E1a to E1d formed at the mounting board MB are respectively coupled to the back terminals TEPa to TEPd formed at the back surface of the PA module PA shown in FIG. 13. In actually mounting the PA module PA over the mounting board MB, as shown in FIG. 14, solder SOL is formed over each of the electrodes E1a to E1d formed at the mounting board MB. The electrode patterns of the electrodes E1a to E1d formed at the mounting board MB are not changed.

Figure 15:
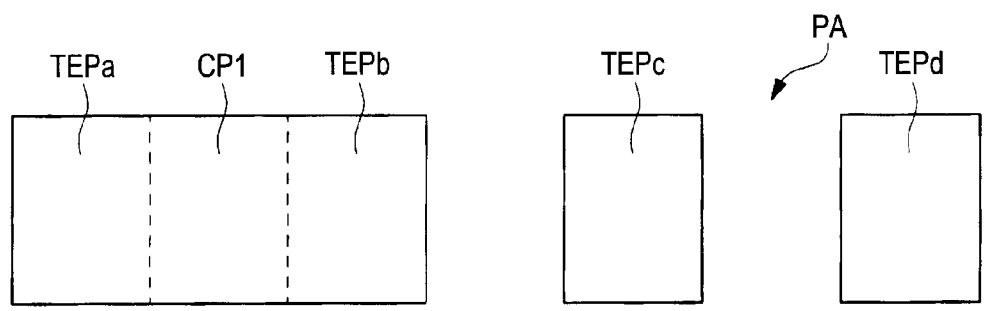
FIG. 15 is a diagram showing back terminals formed in a PA module of a comparative example.

On the other hand, FIG. 15 shows the back terminals TEPa to TEPd formed in the PA module PA. As can be seen from FIGS. 14 and 15, the electrodes E1a to E1d shown in FIG. 14 are found to correspond to the back terminals TEPa to TEPd shown in FIG. 15. At this time, the back terminals TEPa and the TEPb shown in FIG. 15 are electrically coupled together by the back conductor pattern CP1.

Figure 16:
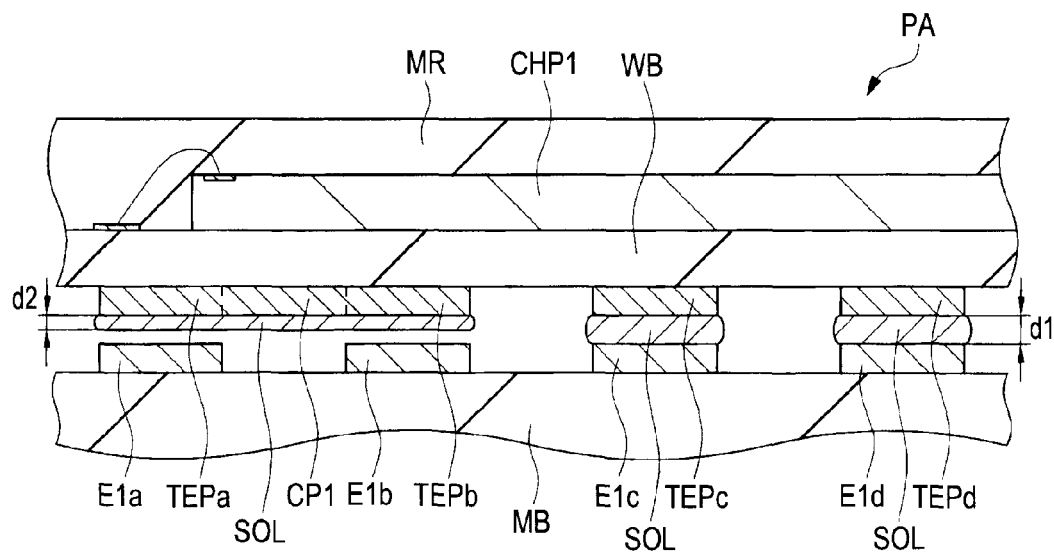
FIG. 16 is a cross-sectional view of the PA module mounted on the mounting board in the comparative example.

FIG. 16 is a cross-sectional view of the PA module PA mounted over the mounting board MB. As shown in FIG. 16, the back terminals TEPa to TEPd formed in the PA module PA are electrically coupled to the electrodes E1a to E1d formed at the mounting board MB via the solder SOL. Specifically, after forming the solder SOL on the electrodes E1a to E1d formed at the mounting board MB by solder printing or the like, the PA module PA is arranged over the mounting board MB such that the back terminals TEPa to TEPd of the PA module PA are opposed to the electrodes E1a to E1d. The back terminals TEPa to TEPd are bonded to the electrodes E1a to E1d via the solder SOL by applying a reflow process (heat treatment) to the mounting board MB with the PA module PA mounted thereover to melt the solder SOL.

As shown in FIG. 14, since the shape of each of the electrodes E1a to E1d formed on the mounting board MB does not change, the amounts of the solders SOLs formed on the respective electrodes E1a to E1d are constant. Reference character "A" is the area of each of the electrodes E1a to E1d, and reference character "B" is the amount (volume) of the solder SOL formed over each of the electrodes E1a to E1d.

On the other hand, in the PA module PA shown in FIG. 15, the area of each of the back terminals TEPa to TEPd is "A" that is the same as that of each of the electrodes E1a to E1d. Further, the back terminal TEPa is electrically coupled to the back terminal TEPb. The area of the back conductor pattern CP1 for coupling the back terminal TEPa to the back terminal TEPb is also represented by "A".

At this time, as shown in FIG. 16, the back terminal TEPc and the back terminal TEPd are not coupled together by a conductor pattern. Since the area of each of the back terminal TEPc and the back terminal TEPd is represented by "A" and the amount of the solder SOL spreading over each of the back terminal TEPc and the back terminal TEPd is represented by "B", the height of the solder SOL is represented by d1 (=B/A).

On the other hand, the electrode E1a is coupled to the back terminal TEPa, and the electrode E1b is coupled to the back terminal TEPb, but the back terminal TEPa is coupled to the back terminal TEPb by the back conductor pattern CP1. Thus, the solder SOL formed at the electrode E1a and the electrode E1b spreads not only over the back terminal TEPa and the back terminal TEPb, but also over the back conductor pattern CP1 formed between the back terminal TEPa and the back terminal TEPb. That is, the solder SOL (whose amount is represented by "2B") formed over the electrodes E1a and E1b spreads over the area of "3A" obtained by adding the area of the back terminal TEPa, the area of the back terminal TEPb, and the area of the back conductor pattern CP1. Thus, the height of the solder SOL spreading over the back terminal TEPa, the back terminal TEPb, and the back conductor pattern CP1 is represented by "d2 (=2B/3A)".

As can be seen from the above discussion, the height (d2) of the solder SOL is smaller than the height (d1) of the solder SOL, which increases the possibility that the back terminals TEPa and TEPb are not electrically coupled to the electrodes E1a and E1b. That is, the height (d2) of the solder SOL spreading over the back terminal TEPa and the back terminal TEPb coupled together by the back conductor pattern CP1 becomes small (nonuniform) as compared to the height (d1) of the solder SOL spreading over the back terminal TEPc and the back terminal TEPd. As a result, the back terminal TEPa and the back terminal TEPb for supplying the ground potential are not coupled to the electrodes E1a and E1b over the mounting board MB.

This means that even when the back terminal TEPa and the back terminal TEPb for applying the ground potential on the PA module PA side are coupled together by the back conductor pattern CP1, the back terminals TEPa and TEPb are not electrically coupled to the electrodes E1a and E1b for supplying the ground potential at the mounting board MB side.

Thus, the ground potential of the PA module PA is electrically isolated from the ground potential supplied from the mounting board MB, which leads to inconvenience that the common ground potential cannot be achieved. When the common ground potential cannot be provided between the PA module PA and the mounting board MB, the individual ground potentials become unstable in the PA module PA, which degrades the electric properties of the PA module PA. That is, even when the back terminal TEPa and the back terminal TEPb are electrically coupled together by the back conductor pattern CP1 so as to achieve the common ground potential on the PA module PA side, the coupling between the PA module PA and the mounting board MB fails, which cannot improve the electric properties of the PA module PA.

The problem with the conventional example will show the following. The coupling between the back terminals TEPa and TEPb for applying the ground potential in the PA module PA via the back conductor pattern CP1 without changing the layout structure of the electrodes E1a and E1b on the mounting board MB side simply reduces the reliability of coupling between the PA module PA and the mounting board MB. As a result, this cannot achieve the object to improve the electric properties of the PA module PA by achieving the commonality of the back terminal TEPa and the back terminal TEPb for applying the ground potential. That is, on the condition where the layout of the electrodes on the mounting board MB side is not changed, another measures needs to be added to the structure including the back terminals TEPa and TEPb for applying the ground potential which are coupled together via the back conductor pattern CP1.

In addition to the above-mentioned state, when warpage occurs in the PA module PA, the reliability of coupling between the PA module PA and the mounting board MB is reduced. At present, a polycarbonate (PCB) material is used as material for the wiring board WB included in the PA module PA. The wiring board WB comprised of the PCB material has a higher degree of flatness than a wiring board WB of ceramic material, such as alumina. The wiring board WB comprised of the PCB (polycarbonate) material does not have a problem of warpage. For example, however, when the semiconductor chip CHP1 and the semiconductor chip CHP2 to be mounted over the wiring board WB are combined into one large semiconductor chip so as to reduce the size of a package, the semiconductor chip mounted over the wiring board WB becomes large. Thus, a large difference in coefficient of linear expansion between the wiring board WB and the semiconductor chip can result in the problem of warpage even of the wiring board WB produced using the PCB material. Even in this case, if the height of the solder SOL can be surely made uniform, the reliability of coupling between the PA module PA and the mounting board MB can be ensured sufficiently. Accordingly, it is very important that the height of the solder SOL is made uniform to improve the reliability of coupling between the PA module PA and the mounting board MB even when the commonality of the back terminals TEPa and TEPb for applying the ground potential is achieved so as to improve the electric properties of the PA module PA.

Figure 17:
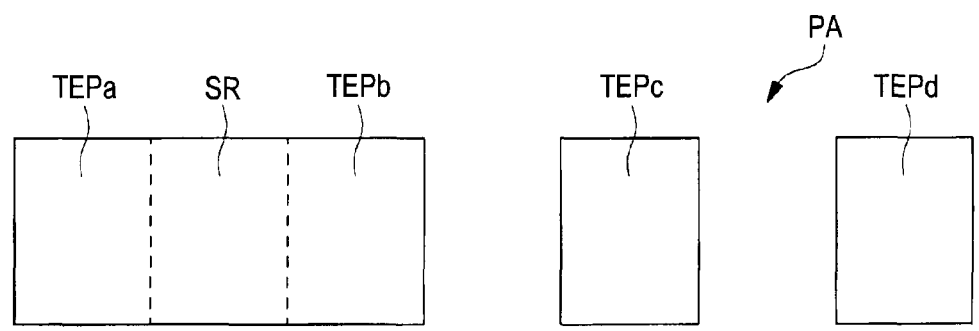
FIG. 17 is a diagram showing terminals formed in the PA module in another comparative example.
Figure 18:
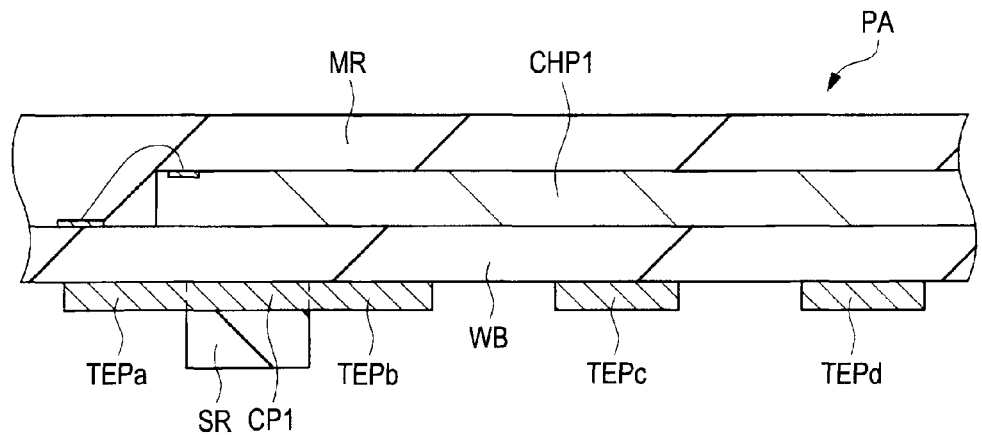
FIG. 18 is a cross-sectional view of the PA module mounted on the mounting board in a further comparative example.
Figure 19:
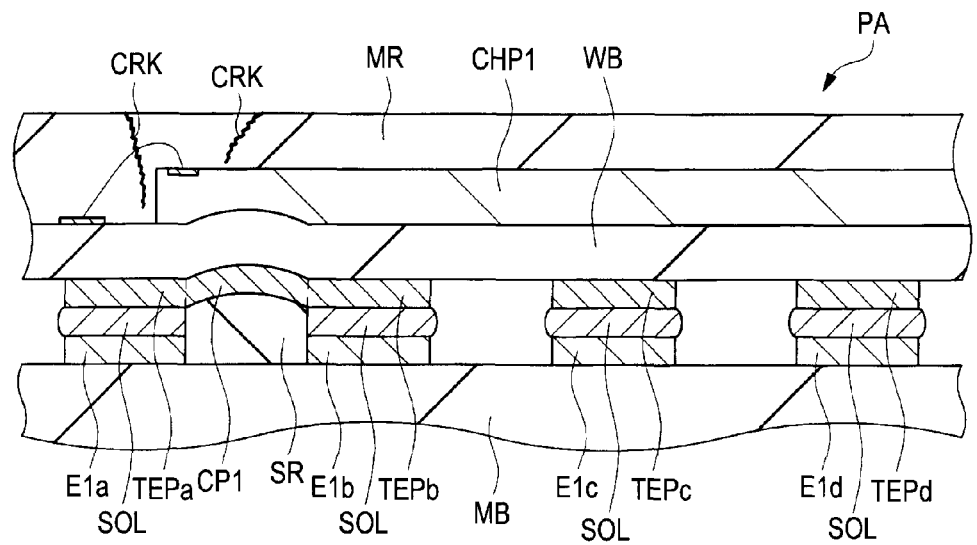
FIG. 19 is a diagram for explaining problems occurring when the PA module of the further comparative example is mounted on the mounting board.

As one means for solving the problem in the comparative example, as shown in FIG. 17, the formation of a solder resist SR on a conductor pattern for coupling the back terminals TEPa and TEPb is proposed in the structure for coupling the back terminals TEPa and TEPb formed at the back surface of the PA module PA (note that in FIG. 17, the conductor pattern (not shown) is covered with the solder resist SR). That is, as shown in FIG. 18, the back terminal TEPa and the back terminal TEPb which are formed at the back surface of the wiring board WB are electrically coupled together by the back conductor pattern CP1, and the solder resist SR formed of insulating material is formed on the back conductor pattern CP1. This arrangement can prevent the solder on the back conductor pattern CP1 for coupling the back terminals TEPa and TEPb from spreading out in mounting the PA module PA over the mounting board MB. That is, as shown in FIG. 19, the back terminal TEPa and the electrode E1a are coupled together via the solder SOL. In applying the reflow process to the solder SOL, even when the solder SOL formed on the electrode E1a is melted, the formed solder resist SR serves as a wall to prevent the solder SOL from spreading out from the back terminal TEPa toward the back conductor pattern CP1. As a result, the height of the solder SOL intervening between the back terminal TEPa and the electrode E1a can be ensured. For the same reason, the height of the solder SOL between the back terminal TEPb and the electrode E1b can be ensured.

Referring to FIG. 19, the solder resist SR is formed on the back conductor pattern CP1, so that the part including the pattern CP1 is located higher than other areas (the height of the back terminal TEPa and the height of the back terminal TEPb) by the thickness of the solder resist SR. As shown in FIG. 19, when the back terminals TEPa to TEPd are coupled to the electrodes E1a to E1d, the solder resist SR breaks into the back conductor pattern CP1 and the wiring board WB from the area with the solder resist SR formed therein to deform the wiring board WB, thus generating stress on the wiring board WB. The stress generated in the wiring board WB is transferred to the semiconductor chip CHP1 mounted on the wiring board WB, and to a resin member MR covering the semiconductor chip CHP1. As a result, cracks CRKs are caused in the semiconductor chip CHP1 itself, or the resin member MR, for example. The occurrence of the cracks CRK in the resin member MR leads to reduction in reliability of the package. Therefore, as shown in FIG. 19, it is found that the PA module PA should not employ the structure including the back terminal TEPa and the back terminal TEPb electrically coupled together by the back conductor pattern CP1, and the solder resist SR formed as the insulating material on the back conductor pattern CP1.

As mentioned above, at present, the related art cannot achieve the technical idea for improving the reliability of coupling between the PA module PA and the mounting board MB, while coupling the back terminals TEPa and TEPb for applying the ground potential on the PA module PA side by the back conductor pattern CP1 without changing the layout of the electrodes on the mounting board MB. The following will describe the PA module PA of this embodiment which improves the electric properties of the PA module PA, while improving the reliability of coupling between the PA module PA and the mounting board MB.

Figure 20:
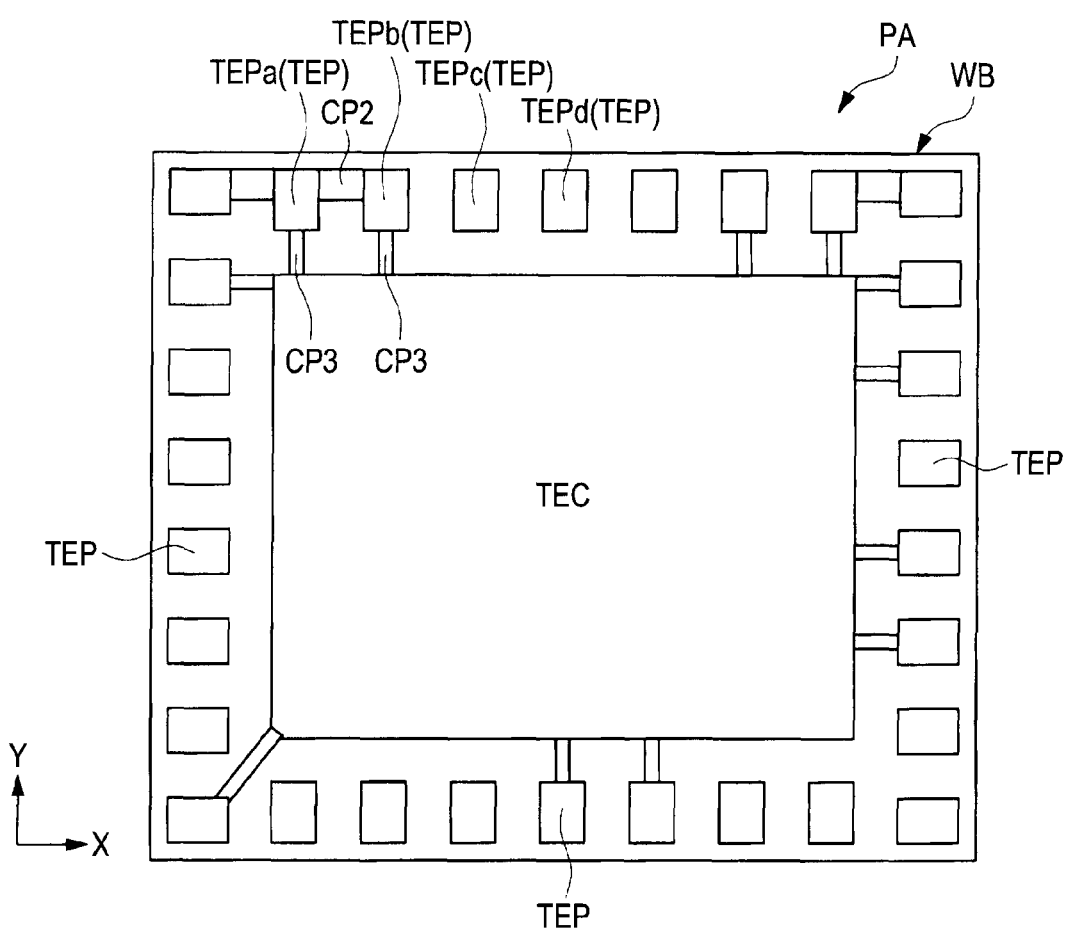
FIG. 20 is a diagram showing a layout structure of a back surface of a PA module in the embodiment.

FIG. 20 is a plan view showing a layout of the back surface of a PA module PA according to this embodiment. As shown in FIG. 20, the wiring board WB included in the PA module PA has at its back surface, the back terminal TEC having a large area and formed in the center of the wiring board WB, and the back terminals TEPs formed around the back terminal TEC. The back terminal TEC is a terminal to which the ground potential is applied (terminal for a first reference potential) (center ground terminal). The back terminals TEPs include a signal terminal to which a signal is applied, a terminal for a power supply potential to which a power supply voltage is applied, and a terminal for a reference potential to which a reference potential (ground potential) is applied. Specifically, among the back terminals TEPs, for example, as shown in FIG. 20, the back terminals TEPa to TEPd are arranged. At this time, the back terminal TEPa (terminal for a second reference potential) (first peripheral ground terminal)

and the back terminal TEPb (terminal for a third reference potential) (second peripheral ground terminal) are terminals to which the ground potential is applied. The back terminal TEPc and the back terminal TEPd are terminals for signals to which signals are applied.

In the PA module PA of this embodiment as shown in FIG. 20, a plurality of terminals for supplying the reference potential (ground potential) exist at the back surface of the wiring board WB. As shown in FIG. 2, this is because the ground potential needs to be supplied to each of amplifier stage (circuit elements) of the amplifier circuit LB and the amplifier circuit HB in the power amplifier 6, and, for example, the back terminals TEC, TEPa, and TEPb for supplying the reference potential (ground potential) are formed so as to be coupled to these circuit elements. For example, the terminal for supplying the ground potential GND1 shown in FIG. 3 corresponds to the back terminal TEC. The terminal for supplying the ground potential GND2 corresponds to the back terminal TEPa. The terminal for supplying the ground potential GND3 corresponds to be the back terminal TEPb.

Also, in this embodiment, like the comparative example, the back terminals TEC, TEPa, and TEPb formed as an independent pattern are electrically coupled together so as to stably supply the reference potential (ground potential). That is, the respective back terminals TEC, TEPa, and TEPb are electrically coupled to achieve the commonality thereof, which can reduce fluctuations of ground potential to supply the stable ground potential. That is, the back terminals TEC, TEPa, and TEPb for applying the reference potential (ground potential) are electrically coupled together, whereby the stable ground potential with small fluctuations of voltage can be supplied thereby to improve the electrical properties of the PA module PA. In the example where the electrical properties of the PA module PA are improved, the back terminals TEC, TEPa, and TEPb are electrically coupled to thereby improve the stability of the ground potential. The stable ground potential with small fluctuations can be supplied to the amplifier circuits LB and HB shown in FIG. 2, so that the oscillation phenomenon at the amplifier circuits LB and HB can be suppressed.

Specifically, in this embodiment, the back terminal TEPa and the back terminal TEPb for supplying the ground potential are electrically coupled together by the back conductor pattern CP2. Likewise, the back terminals TEPa and TEC for supplying the ground potential are electrically coupled together by the back conductor pattern CP3. The back terminal TEPb and the back terminal TEC are also electrically coupled together by the back conductor pattern CP3. Thus, in the PA module PA of this embodiment, the back terminal TEC formed in the center of the back surface of the wiring board WB and the back terminals TEPa and TEPb are electrically coupled together by the respective back conductor patterns CP3s. The back terminal TEPa and the back terminal TEPb arranged adjacent to each other around the perimeter of the wiring board WB are electrically coupled together by the back conductor pattern CP2.

One of the features of this embodiment is the size of the back conductor pattern CP2 for coupling the back terminals TEPa and TEPb formed around the perimeter of the wiring board WB. That is, as shown in FIG. 20, the width of the back conductor pattern CP2 is small as compared to the width of each of the back terminals TEPa and TEPb. In detail, for example, the back terminal TEPa and the back terminal TEPb are arranged in parallel in the X direction. The back terminal TEPa and the back terminal TEPb arranged in parallel in the X direction are coupled together by the back conductor pattern CP2. At this time, the coupling direction (coupling line direction) of the back conductor pattern CP2 is the X direction. Taking into consideration the Y direction orthogonal to (intersecting) the X direction, the width of the back conductor pattern CP2 in the Y direction is smaller than the width of each of the back terminal TEPa and the back terminal TEPb in the Y direction. In particular, in this embodiment, the area of the back conductor pattern CP2 is smaller than the area of each of the back terminal TEPa (terminal for the second reference potential) and the back terminal TEPb (terminal for the third reference potential).

In this way, the width of the back conductor pattern CP2 in the Y direction is made small as compared to the width of each of the back terminals TEPa and TEPb in the Y direction, which can improve the reliability of coupling between the PA module PA and the mounting board MB, while electrically coupling the back terminal TEPa to the back terminal TEPb via the back conductor pattern CP2. The following will describe the improvement of the reliability of coupling between the PA module PA and the mounting board MB by making the width of the back conductor pattern CP2 in the Y direction small as compared to the width of each of the back terminals TEPa and TEPb in the Y direction.

Figure 21:
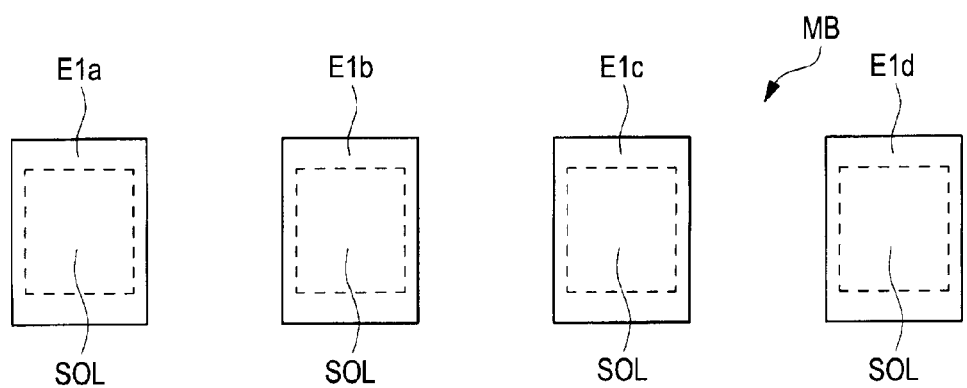
FIG. 21 is a diagram showing parts of electrodes formed in the mounting board.

First, the detailed structure including the PA module PA of this embodiment mounted on the mounting board MB will be described below by taking as an example, the case where the back terminals TEPa to TEPd formed at the back surface of the PA module PA are coupled to the electrodes formed at the mounting board MB. FIG. 21 shows the arrangement of the electrodes on the mounting board MB corresponding to the back terminals TEPa to TEPd formed at the back surface of the PA module PA shown in FIG. 20. FIG. 21 shows the electrodes E1a to E1d, which are parts of the electrodes formed at the mounting board MB. The electrodes E1a to E1d are arranged over the mounting board MB with a predetermined clearance therebetween. The electrodes E1a to E1d formed over the mounting board MB are respectively coupled to the back terminals TEPa to TEPd formed at the back surface of the PA module PA shown in FIG. 20. In actually mounting the PA module PA over the mounting board MB, as shown in FIG. 21, the solder SOL is formed over each of the electrodes E1a to E1d formed on the mounting board MB. The electrode patterns of the electrodes E1a to E1d formed at the mounting board MB are not changed.

Figure 22:
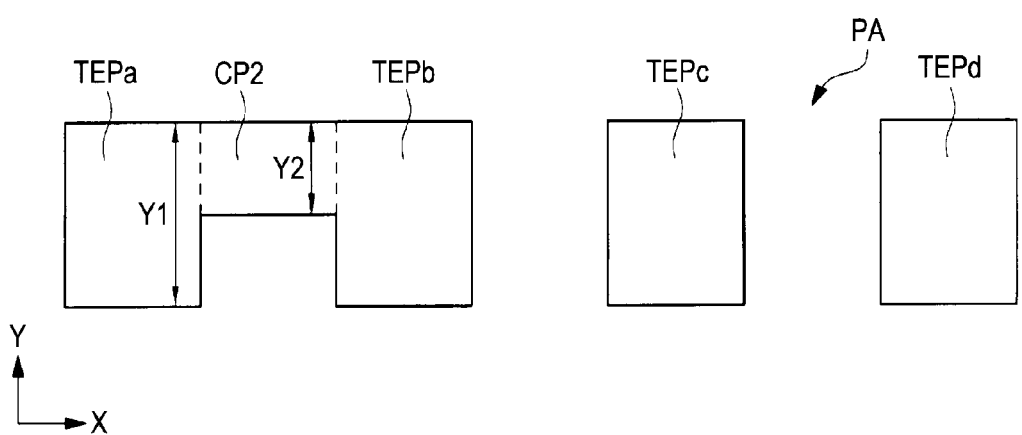
FIG. 22 is a diagram showing terminals formed in the PA module of the embodiment.

FIG. 22 is a diagram showing the back terminals TEPa to TEPd formed at the back surface of the PA module PA in this embodiment. As shown in FIG. 22, in this embodiment, the rectangular back terminals TEPa to TEPd are arranged in parallel in the X direction. The back terminal TEPa and the back terminal TEPb arranged adjacent to each other are coupled together by the back conductor pattern CP2. The back terminal TEPa and the back terminal TEPb are terminals to which the ground potential is applied. In order to stabilize the ground potential, the back terminal TEPa and the back terminal TEPb are coupled together by the rectangular back conductor pattern CP2. At this time, this embodiment has the feature that the width of the back conductor pattern CP2 is smaller than that of each of the back terminals TEPa and TEPb. That is, as shown in FIG. 22, when Y1 is the width of each of the back terminals TEPa and TEPb in the Y direction, and Y2 is the width of the back conductor pattern CP2 in the Y direction, the back conductor pattern CP2 is formed so as to satisfy the following relationship: Y2<Y1. As described above, this embodiment has the feature that the width Y2 of the back conductor pattern CP2 in the Y direction is smaller than the width Y1 of each of the back terminals TEPa and TEPb in the Y direction. This feature is achieved not only by the structure shown in FIG. 22, but also by other structures, including the structure shown in FIG. 23.

Figure 23:
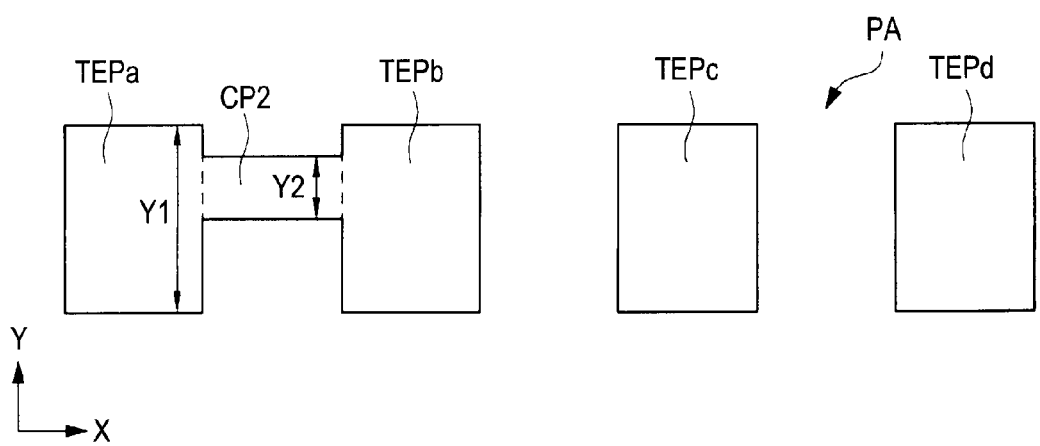
FIG. 23 is a diagram showing terminals having another structure and formed in the PA module of the embodiment.

Referring to FIG. 23, the width Y2 of the back conductor pattern CP2 in the Y direction is made smaller than the width Y1 of each of the back terminals TEPa and TEPb in the Y direction. As shown in FIG. 22, one side of the back terminal TEPa (back terminal TEPb) in the X direction and one side of the back conductor pattern CP2 in the X direction are arranged in a straight line. And the other side of the back terminal TEPa (back terminal TEPb) in the X direction, and the other side of the back conductor pattern CP2 in the X direction are not arranged in a straight line. On the other hand, as shown in FIG. 23, both sides of the back terminal TEPa (back terminals TEPb) in the X direction and both sides of the back conductor pattern CP2 in the X direction are not arranged in a straight line. As mentioned above, although the structure shown in FIG. 22 specifically differs from the structure shown in FIG. 23 in that the width Y2 of the back conductor pattern CP2 in the Y direction is made smaller than the width Y1 of each of the back terminals TEPa and TEPb in the Y direction, either of these structures can improve the reliability of coupling between the PA module PA and the mounting board MB.

Specifically, this embodiment can improve the reliability of coupling between the PA module PA and the mounting board MB, which will be described below.

Figure 24:
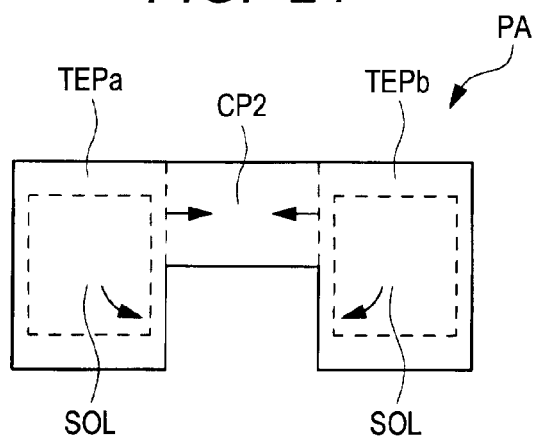
FIG. 24 is a diagram showing a state in which solder is spreaded between the terminals formed in the PA module when mounting the PA module of the embodiment over the mounting board.

FIG. 24 is a diagram showing a state in which the solder SOL is brought into intimate contact with the back terminals TEPa and TEPb formed in the PA module PA in mounting the PA module PA on the mounting board. As shown in FIG. 24, the solder applied to the electrode formed at the mounting board, that is, the solder SOL is in intimate contact with, for example, the back terminals TEPa and TEPb of the PA module PA in bringing the mounting board into contact with the PA module PA. At this time, the back terminal TEPa and the back terminal TEPb are coupled together by the back conductor pattern CP2, so that the solder SOL in intimate contact with each of the back terminals TEPa and TEPb spreads out over the back conductor pattern CP2. Since the width of the back conductor pattern CP2 is smaller than the width of each of the back terminals TEPa and TEPb in this embodiment, the area of the back conductor pattern CP2 is small, which can suppress the spread of the solder SOL over the back conductor pattern CP2. Further, the width of the back conductor pattern CP2 is made smaller than the width of each of the back terminals TEPa and TEPb in this embodiment, which results in a dent at the boundary between the back terminal TEPa (or back terminal TEPb) and the back conductor pattern CP2. The formation of the dent can suppress the inflow of the solder SOL from the back terminal TEPa or back terminal TEPb into the back conductor pattern CP2.

That is, this embodiment has the feature that the width of the back conductor pattern CP2 is made smaller than the width of each of the back terminals TEPa and TEPb, and hence can suppress the spread of the solder SOL from the back terminal TEPa or back terminal TEPb into the back conductor pattern CP2. As mentioned above, the characteristic structure of this embodiment can stabilize the ground potential by electrically coupling the back terminals TEPa and TEPb for applying the ground potential by the back conductor pattern CP2. Since the width of the back conductor pattern CP2 is made smaller than the width of each of the back terminals TEPa and TEPb, even when the back terminals TEPa and TEPb are coupled together by the back conductor pattern CP2, the solder SOL can be prevented from spreading out from the back terminal TEPa or TEPb into the back conductor pattern CP2.

Making the width of the back conductor pattern CP2 smaller than the width of each of the back terminal TEPa and TEPb achieves the following two functions. The first function is that the area of the back conductor pattern CP2 can be made small. This function can lessen the amount of solder SOL spreading into the back conductor pattern CP2. The second function is that the dent is inevitably formed at the boundary between the back terminal TEPa (or back terminal TEPb) and the back conductor pattern CP2 because the width of the back conductor pattern CP2 is made smaller than the width of each of the back terminals TEPa and TEPb. The dent acts as a wall for suppressing the spread of the solder SOL.

The characteristic structure of this embodiment can achieve the first and second functions, which can sufficiently suppress the spread of the solder SOL from the back terminals TEPa and TEPb into the back conductor pattern CP2. This means that even when the back terminals TEPa and TEPb are coupled together by the back conductor pattern CP2, most of the solder SOL is localized on the back terminals TEPa and TEPb, which can ensure an adequate thickness of the solder SOL over the back terminals TEPa and TEPb. Accordingly, the structure of this embodiment can improve the reliability of coupling between the electrodes formed at the mounting board and the back terminals TEPa and TEPb (on the PA module PA side) coupled together by the back conductor pattern CP2.

Figure 25:
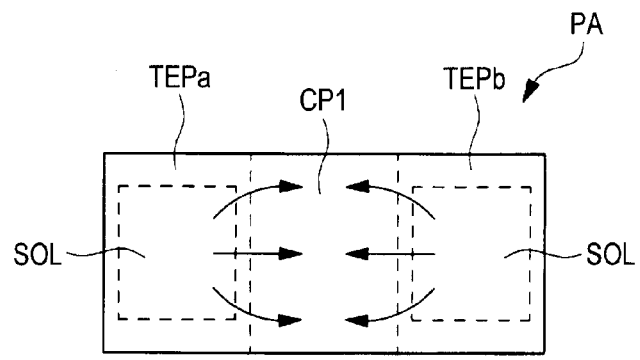
FIG. 25 is a diagram showing a state in which solder is spreaded between the terminals formed in the PA module when mounting the PA module of the comparative example over the mounting board.

FIG. 25 shows a state in which the solder SOL is brought into intimate contact with the back terminals TEPa and TEPb formed in the PA module PA in mounting the PA module PA over the mounting board in a comparative example. As shown in FIG. 25, the solder applied to the electrode formed at the mounting board, that is, the solder SOL is in intimate contact with, for example, the back terminals TEPa and TEPb of the PA module PA by bringing the mounting board into contact with the PA module PA. At this time, the back terminal TEPa and the back terminal TEPb are coupled together by the back conductor pattern CP1, so that the solder SOL in intimate contact with each of the back terminals TEPa and TEPb spreads out over the back conductor pattern CP1. The width of the back conductor pattern CP1 is substantially the same as that of each of the back terminals TEPa and TEPb. In the comparative example, the solder SOL in intimate contact with the back terminal TEPa (or back terminal TEPb) tends to easily spread out within the back conductor pattern CP1 as compared to this embodiment. Further, since the width of the back conductor pattern CP1 is the same as that of each of the back terminals TEPa and TEPb in the comparative example, no dent is formed at the boundary between the back terminal TEPa or TEPb and the pattern CP1. Thus, in the comparative example, the solder SOL in intimate contact with the back terminal TEPa or TEPb may spread out into the back conductor pattern CP1.

By comparison between the structure shown in FIG. 24 and the structure shown in FIG. 25, in the comparative example, the area of the back conductor pattern CP1 becomes large, and the width of each of the back terminal TEPa and the back terminal TEPb is the same as that of the back conductor pattern CP1. As a result, no dent is formed at the boundary between the back terminal TEPa (or back terminal TEPb) and the back conductor pattern CP1. On the other hand, this embodiment has the feature that the width of the back conductor pattern CP2 is made smaller than the width of each of the back terminals TEPa and TEPb. Thus, the area of the back conductor pattern CP2 becomes small, and the width of the back conductor pattern CP2 is smaller than the width of each of the back terminals TEPa and TEPb, which results in the dent at the boundary between the back terminal TEPa (or back terminal TEPb) and the back conductor pattern CP2. Accordingly, this embodiment exhibits an outstanding effect of being capable of sufficiently suppressing the spread of the solder SOL from the back terminals TEPa and TEPb to the back conductor pattern CP2 as compared to the comparative example.

Figure 26:
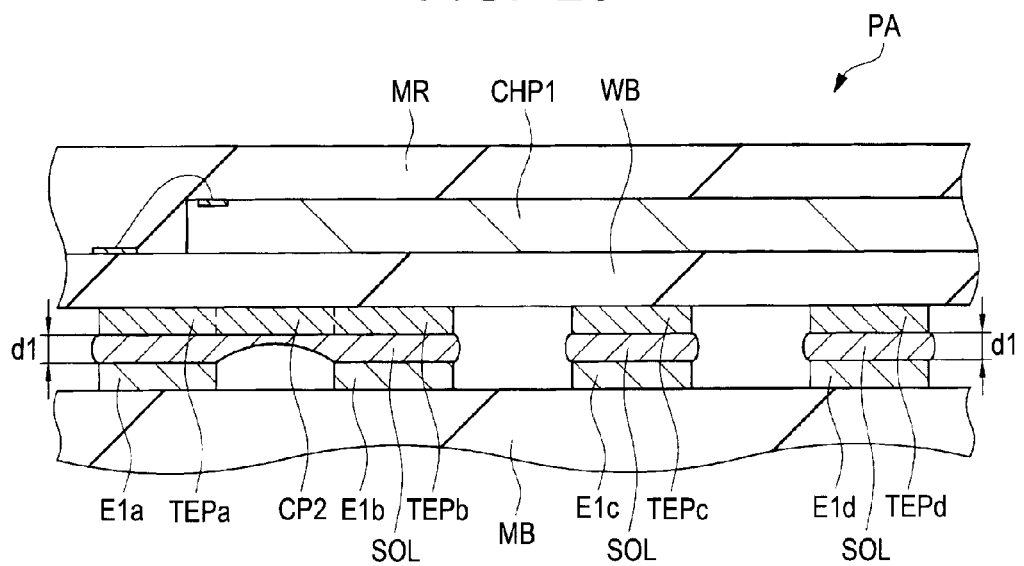
FIG. 26 is a cross-sectional view of the PA module of the embodiment mounted over the mounting board.

FIG. 26 is a cross-sectional view showing a state in which the PA module PA of this embodiment is mounted over the mounting board MB. As shown in FIG. 26, the thickness of the solder SOL in intimate contact with the back terminals TEPc and TEPd which are isolated patterns is "d1". On the other hand, taking into consideration the back terminals TEPa and TEPb coupled together by the back conductor pattern CP2, in this embodiment, only a little solder SOL spreads over the back conductor pattern CP2. Since the width of the back conductor pattern CP2 is smaller than the width of each of the back terminals TEPa and TEPb in this embodiment, the amount of solder SOL spreading over the back conductor pattern CP2 can be decreased. Thus, the solder SOL in intimate contact with the back terminals TEPa and TEPb is almost localized on the back terminal TEPa and the back terminal TEPb, so that the thickness of the solder SOL in intimate contact with the back terminals TEPa and TEPb is substantially "d1". Thus, the thickness of the solder SOL in intimate contact with the back terminal TEPa and TEPb coupled together by the back conductor pattern CP2 can be substantially the same as that of the solder SOL in intimate contact with the back terminals TEPc and TEPd which are not coupled by a conductor pattern and isolated from each other. This means that this embodiment can improve the reliability of coupling between the back terminals TEPa to TEPd formed at the PA module PA and the electrodes E1a to E1d formed at the mounting board MB. As mentioned above, this embodiment exhibits the outstanding effect of being capable of sufficiently ensuring the reliability of coupling between the PA module PA and the mounting board MB on the assumption that the terminals for supplying the ground potential are coupled together by the conductor pattern on the PA module PA side. Thus, the electrical properties of the PA module PA can be surely improved.

Although this embodiment has the feature that the width of the back conductor pattern CP2 is smaller than the width of each of the back terminals TEPa and TEPb, the inventors have studied how small the width of the back conductor pattern CP2 is made. For example, the smaller the width of the back conductor pattern CP2, the smaller the area of the back conductor pattern CP2 can be, and the larger the dent between the back terminal TEPa (or back terminal TEPb) and the back conductor pattern CP2 can be. From this point, it is desirable that the width of the back conductor pattern CP2 is made small as much as possible for the purpose of not spreading the solder SOL toward the back conductor pattern CP2. On the other hand, it is not desirable that the width of the back conductor pattern CP2 is smaller than necessary for the purpose of surely establishing electrical coupling between the back terminal TEPa and the back terminal TEPb. Therefore, in order to achieve both of reliable electrical coupling between the back terminals TEPa and TEPb and prevention of spread of the solder SOL from the back terminal TEPa (or back terminal TEPb) into the back conductor pattern CP2, the width of the back conductor pattern CP2 is preferably set in a certain range. For example, the width of the back conductor pattern CP2 with respect to the width of the back terminal TEPa (back terminal TEPb) can be set to about 60 to 70% of the width of the back terminal TEPa (or back terminal TEPb).

As shown in FIG. 21, this embodiment is effective especially under the condition where the layout arrangement of the electrodes E1a to E1d on the mounting board MB side is not changed. For example, on the condition where the electrode E1a and the electrode E1b on the mounting board MB side may be coupled together by a conductor pattern, the conductor pattern for coupling the electrodes E1a and E1b on the mounting board MB side are formed in the same shape as that of the conductor pattern for coupling the back terminals TEPa and TEPb on the PA module PA side so as to avoid the problem about the thickness of solder. This is because the solder can be formed over the conductor pattern on the mounting board MB side. That is, the solder can be formed over the electrodes E1a and E1b on the mounting board MB side, and the conductor pattern for coupling the electrodes E1a and E1b. As a result, the solder is uniformly formed on the back terminals TEPa and TEPb on the PA module PA side, and the conductor pattern for coupling the back terminals TEPa and TEPb. In other words, the area of a combination of the electrodes E1a and E1b on the mounting board MB side and the conductor pattern for coupling the electrodes E1a and E1b is the same as that of the back terminals TEPa and TEPb on the PA module PA side and the conductor pattern for coupling the back terminals TEPa and TEPb. Thus, the solder can be formed on the electrodes E1a and E1b on the mounting board MB side and the conductor pattern for coupling the electrode E1a and E1b, which can avoid the problem of nonuniform thickness of the solder. Suppose the electrode E1a and the electrode E1b on the mounting board MB side may be coupled together by the conductor pattern. Under this condition, even when the conductor pattern for coupling the back terminals TEPa and TEPb on the PA module PA side is formed of the back conductor pattern CP1 having the same width as that of the back terminal TEPa like the comparative example, there is no problem as long as the conductor pattern on the mounting board MB side is formed in the same shape as that on the PA module PA side.

The target of this embodiment, however, is the case where the layout arrangement of the electrodes E1a to E1d on the mounting board MB side is not changed. In this case, it is not allowable that the electrode E1a and the electrode E1b are coupled by the conductor pattern. On the other hand, the back terminal TEPa and the back terminal TEPb on the PA module PA side are coupled together by the conductor pattern. As a result, the area of a combination of the electrode E1a and the electrode E1b on the mounting board MB side is smaller than that of a combination of the back terminal TEPa and TEPb on the PA module PA side and the conductor pattern. This means that the solder formed on the electrodes E1a and E1b on the mounting board MB side spreads out over the area of a combination of the back terminals TEPa and TEPb on the PA module PA and the conductor pattern, which results in thinned solder. Therefore, when the back terminals TEPa and TEPb on the PA module PA side are coupled together by the back conductor pattern CP1 without changing the layout arrangement of the electrodes E1a to E1d on the mounting board MB side like the comparative example, the reliability of coupling between the mounting board MB and the PA module PA is problematic.

For this reason, like this embodiment shown in FIG. 22, the width of the back conductor pattern CP2 is made smaller than that of each of the back terminals TEPa and TEPb, which can sufficiently suppress the spread of the solder from the back terminals TEPa and TEPb toward the back conductor pattern CP2. Thus, this embodiment can obtain the outstanding effect of improving the reliability of coupling between the PA module PA and the mounting board MB even when the layout arrangement of the electrodes E1a to E1d on the mounting board MB side is not changed. That is, the PA module PA of this embodiment is very effective especially when the PA module PA is mounted over the mounting board Mb in the following way. The electrode E1a is formed in a first region of the mounting board MB planarly overlapping the back terminal TEPa formed in the PA module PA, and another electrode E1b is formed in a second region of the mounting board MB planarly overlapping the back terminal TEPb formed in the PA module PA. Further, no electrode (pattern) is formed in a region of the mounting board MB planarly overlapping the back conductor pattern CP2 formed at the PA module PA.

Although the back conductor pattern CP2 for coupling the back terminal TEPa to the back terminal TEPb has been described with respect to FIG. 20, the technical idea of this embodiment can also be applied to the case where the back terminal TEC and the back terminal TEPa, or the back terminal TEC and the back terminal TEPb are coupled by the back conductor pattern CP3. For example, referring to FIG. 20, this embodiment has the feature that the width of the back conductor pattern CP3 is smaller than the width of each of the back terminals TEPa and TEC. That is, as shown in FIG. 20, the back conductor pattern CP3 is formed such that the width of the back conductor pattern CP3 in the X direction is smaller than the width of each of the back terminals TEPa and TEC in the X direction. In particular, in this embodiment, the area of the back conductor pattern CP3 is smaller than the area of the back terminal TEPa (terminal for the second reference potential), and the area of the back terminal TEPb.

The characteristic structure of this embodiment in which the width of the back conductor pattern CP3 is smaller than the width of each of the back terminals TEPa and TEPb can suppress the spread of solder from the back terminals TEPa and TEC into the back conductor pattern CP3. Thus, according to the characteristic structure of this embodiment, the back terminals TEPa and TEC to which the ground potential is supplied are electrically coupled together by the back conductor pattern CP3, whereby the ground potential can be stabilized. The width of the back conductor pattern CP3 is made smaller than the width of each of the back terminals TEPa and TEC. Even when the back terminals TEPa and TEC are coupled together by the back conductor pattern CP3, the solder can be prevented from spreading out from the back terminals TEPa and TEC into the back conductor pattern CP3.

Making the width of the back conductor pattern CP3 smaller than the width of each of the back terminals TEPa and TEPb achieves the following two functions. The first function is that the area of the back conductor pattern CP3 can be made small. This function can lessen the amount of solder SOL spreading into the back conductor pattern CP3. The second function is that the dent is inevitably formed at the boundary between the back terminal TEPa (or back terminal TEPb) and the back conductor pattern CP2 because the width of the back conductor pattern CP3 is made smaller than the width of each of the back terminals TEPa and TEPb. The dent acts as a wall for suppressing the spread of the solder SOL.

The characteristic structure of this embodiment can achieve the first and second functions, which can sufficiently suppress the spread of the solder SOL from the back terminal TEPa and TEC into the back conductor pattern CP3. This means that even when the back terminals TEPa and TEC are coupled together by the back conductor pattern CP3, most of the solder SOL is localized on the back terminals TEPa and TEC, which can ensure the adequate thickness of the solder SOL over the back terminals TEPa and TEC. Accordingly, the structure of this embodiment can improve the reliability of coupling between the electrodes formed at the mounting board and the back terminals TEPa and TEC (on the PA module PA side) coupled together by the back conductor pattern CP3.

In particular, this embodiment can obtain the outstanding effect of improving the reliability of coupling between the PA module PA and the mounting board MB even when the layout arrangement of the electrodes E1a to E1d on the mounting board MB side is not changed. That is, the PA module PA of this embodiment is very effective especially when the PA module PA is mounted over the mounting board Mb in the following way. The electrode is formed in the first region of the mounting board MB planarly overlapping the back terminal TEC formed in the PA module PA, and another electrode E1a is formed in the second region of the mounting board MB planarly overlapping the back terminal TEPa formed in the PA module PA. Further, no electrode (pattern) is formed in a region of the mounting board MB planarly overlapping the back conductor pattern CP3 formed at the PA module PA.

The invention made by the inventors has been specifically described above based on the disclosed embodiments. The invention is not limited to the above embodiments, and various modifications can be made without departing from the scope of the invention.

The invention can be widely applied to manufacturing industries for manufacturing semiconductor devices.

What is claimed is:

1. A semiconductor device, comprising:
   (a) a first semiconductor chip having an integrated circuit formed therein to serve as a power amplifier; and
   (b) a rectangular wiring board including a chip mounting surface for mounting the first semiconductor chip thereover, and a back surface opposite to the chip mounting surface, said wiring board having the first semiconductor chip mounted over the chip mounting surface,
   wherein the back surface of the wiring board comprises:
   (b1) a central ground terminal formed in a center of the back surface, and to which a ground potential is applied; and
   (b2) a plurality of peripheral terminals formed around a perimeter of the wiring board so as to surround the central ground terminal,
   wherein the peripheral terminals includes a first peripheral ground terminal and a second peripheral ground terminal which are arranged adjacent to each other, and to each of which the ground potential is applied,
   wherein the first peripheral ground terminal and the second peripheral ground terminal are electrically coupled together by a conductor pattern formed at the back surface, and
   wherein a width of the conductor pattern is smaller than a width of each of the first peripheral ground terminal and the second peripheral ground terminal.

2. A semiconductor device, comprising:
   (a) a first semiconductor chip having an integrated circuit formed therein to serve as a power amplifier;
   (b) a rectangular wiring board including a chip mounting surface for mounting the first semiconductor chip thereover, and a back surface opposite to the chip mounting surface, said wiring board having the first semiconductor chip mounted over the chip mounting surface,
   wherein the back surface of the wiring board comprises:
   (b1) a terminal for a first reference potential formed in a center of the back surface, and to which a reference potential is applied; and
   (b2) a plurality of terminals formed around a perimeter of the wiring board so as to surround the terminal for the first reference potential, wherein the terminals includes a terminal for a second reference potential and a terminal for a third reference potential which are arranged adjacent to each other, and to each of which the reference potential is applied, wherein the terminal for the second reference potential and the terminal for the third reference potential are electrically coupled together by a conductor pattern formed at the back surface, and wherein, when a coupling direction of the conductor pattern for coupling the terminal for the second reference potential and the terminal for the third reference potential is a first direction, and a direction intersecting the first direction is a second direction, a width of the conductor pattern in the second direction is smaller than a width of each of the terminal for the second reference potential and the terminal for the third reference potential in the second direction.

3. A semiconductor device, comprising:
(a) a first semiconductor chip having an integrated circuit formed therein to serve as a power amplifier; and
(b) a rectangular wiring board including a chip mounting surface for mounting the first semiconductor chip thereover, and aback surface disposed opposite to the chip mounting surface so as to be in intimate contact with a mounting board, said wiring board having the first semiconductor chip mounted over the chip mounting surface, wherein the back surface of the wiring board comprises:
(b1) a terminal for a first reference potential formed in a center of the back surface, and to which a reference potential is applied; and
(b2) a plurality of terminals formed around a perimeter of the wiring board so as to surround the terminal for the first reference potential, wherein the terminals includes a terminal for a second reference potential and a terminal for a third reference potential which are arranged adjacent to each other, and to each of which the reference potential is applied, wherein the terminal for the second reference potential and the terminal for the third reference potential are electrically coupled together by a conductor pattern formed at the back surface, wherein a second electrode is formed in a first region of the mounting board planarly overlapping the terminal for the second reference potential formed at the wiring board, wherein a third electrode is formed in a second region of the mounting board planarly overlapping the terminal for the third reference potential formed at the wiring board, wherein said semiconductor device is mounted over the mounting board which does not have any electrode formed in a region thereof planarly overlapping the conductor pattern formed at the wiring board, and wherein, when a coupling direction of the conductor pattern for coupling the terminal for the second reference potential and the terminal for the third reference potential is a first direction, and a direction intersecting the first direction is a second direction, a width of the conductor pattern in the second direction is smaller than a width of each of the terminal for the second reference potential and the terminal for the third reference potential in the second direction.

4. The semiconductor device according to claim 2, wherein an area of the conductor pattern is smaller than that of each of the terminal for the second reference potential and the terminal for the third reference potential.

5. The semiconductor device according to claim 2, wherein an area of the terminal for the first reference potential formed in the center of the back surface of the wiring board is larger than that of each of the terminals formed around the perimeter of the back surface of the wiring board.

6. The semiconductor device according to claim 5,
wherein the terminal for the first reference potential is coupled to the first semiconductor chip mounted over the chip mounting surface of the wiring board through a via penetrating the wiring board, and
wherein the terminal for the first reference potential has a function of radiating heat generated at the first semiconductor chip to an outside.

7. The semiconductor device according to claim 2, wherein the terminals includes a terminal for a signal to which the signal is applied, and a terminal for a power supply potential to which the power supply potential is applied, as well as the terminal for the second reference potential and the terminal for the third reference potential.

8. The semiconductor device according to claim 2, wherein the power amplifier includes a first amplifier circuit for amplifying an input signal in a first frequency band, and a second amplifier circuit for amplifying an input signal in a second frequency band that is higher than the first frequency band.

9. The semiconductor device according to claim 2, wherein the power amplifier amplifies a transmitted power of a cellular phone.

10. The semiconductor device according to claim 2, wherein the semiconductor chip includes silicon as a principal component.

11. The semiconductor device according to claim 10, wherein the first semiconductor chip has a LDMOSFET formed therein.

12. The semiconductor device according to claim 11, wherein a source electrode of the LDMOSFET is coupled to a ground potential, and a drain electrode of the LDMOSFET is coupled to a power supply potential.

13. The semiconductor device according to claim 12, wherein the source electrode of the LDMOSFET is electrically coupled to the terminal for the second reference potential and the terminal for the third reference potential formed at the wiring board.

14. The semiconductor device according to claim 2, wherein a second semiconductor chip having an antenna switch formed therein is mounted over the chip mounting surface of the wiring board.

15. The semiconductor device according to claim 14, wherein the second semiconductor chip includes a compound semiconductor as a principal component.

16. The semiconductor device according to claim 15, wherein the second semiconductor has a high electron mobility transistor formed therein.

17. The semiconductor device according to claim 2, wherein the wiring board is a multilayer wiring board formed of polycarbonate material.

18. A semiconductor device, comprising:
(a) a first semiconductor chip having an integrated circuit formed therein to serve as a power amplifier; and
(b) a rectangular wiring board including a chip mounting surface for mounting the first semiconductor chip thereover, and a back surface opposite to the chip mounting surface, said wiring board having the first semiconductor chip mounted over the chip mounting surface, wherein the back surface of the wiring board comprises:
(b1) a central ground terminal formed in a center of the back surface, and to which a ground potential is applied; and (b2) a plurality of peripheral terminals formed around a perimeter of the wiring board so as to surround the central ground terminal, wherein the peripheral terminals include a first peripheral ground terminal to which a ground potential is applied, wherein the central ground terminal and the first peripheral ground terminal are electrically coupled together by a conductor pattern formed at the back surface, and wherein a width of the conductor pattern is smaller than a width of the first peripheral ground terminal.

19. A semiconductor device, comprising:
    (a) a first semiconductor chip having an integrated circuit formed therein to serve as a power amplifier; and
    (b) a rectangular wiring board including a chip mounting surface for mounting the first semiconductor chip thereover, and a back surface opposite to the chip mounting surface, said wiring board having the first semiconductor chip mounted over the chip mounting surface, wherein the back surface of the wiring board comprises:
    (b1) a terminal for a first reference potential formed in a center of the back surface, and to which a reference potential is applied; and
    (b2) a plurality of terminals formed around a perimeter of the wiring board so as to surround the terminal for the first reference potential, wherein the terminals include a terminal for a second reference potential to which a reference potential is applied, wherein the terminal for the first reference potential and the terminal for the second reference potential are electrically coupled together by a conductor pattern formed at the back surface, and wherein, when a coupling direction of the conductor pattern for coupling the terminal for the second reference potential and the terminal for the first reference potential is a first direction, and a direction intersecting the first direction is a second direction, a width of the conductor pattern in the second direction is smaller than a width of the terminal for the second reference potential in the second direction.

20. A semiconductor device, comprising:
    (a) a first semiconductor chip having an integrated circuit formed therein to serve as a power amplifier; and
    (b) a rectangular wiring board including a chip mounting surface for mounting the first semiconductor chip thereover, and a back surface disposed opposite to the chip mounting surface so as to be in intimate contact with a mounting board, said wiring board having the first semiconductor chip mounted over the chip mounting surface, wherein the back surface of the wiring board comprises:
    (b1) a terminal for a first reference potential formed in a center of the back surface, and to which a reference potential is applied; and
    (b2) a plurality of terminals formed around a perimeter of the wiring board so as to surround the terminal for the first reference potential, wherein the terminals includes a terminal for a second reference potential to which the reference potential is applied, wherein the terminal for the first reference potential and the terminal for the second reference potential are electrically coupled together by a conductor pattern formed at the back surface, wherein a first electrode is formed in a first region of the mounting board planarly overlapping the terminal for the first reference potential formed at the wiring board, wherein a second electrode is formed in a second region of the mounting board planarly overlapping the terminal for the second reference potential formed at the wiring board, wherein said semiconductor device is mounted over the mounting board which does not have any electrode formed in a region thereof planarly overlapping the conductor pattern formed at the wiring board, and wherein, when a coupling direction of the conductor pattern for coupling the terminal for the second reference potential and the terminal for the first reference potential is a first direction, and a direction intersecting the first direction is a second direction, a width of the conductor pattern in the second direction is smaller than a width of the terminal for the second reference potential in the second direction.

* * * * *